US009628122B1

(12) United States Patent
Clark et al.

(10) Patent No.: US 9,628,122 B1
(45) Date of Patent: Apr. 18, 2017

(54) CIRCUITS AND METHODS FOR REDUCING INTERFERENCE THAT SPECTRALLY OVERLAPS A DESIRED SIGNAL BASED ON DYNAMIC GAIN CONTROL AND/OR EQUALIZATION

(71) Applicant: The Aerospace Corporation, El Segundo, CA (US)

(72) Inventors: Christopher J. Clark, Hermosa Beach, CA (US); Robert B. Dybdal, Palos Verdes Estates, CA (US); Fei Wang, San Gabriel, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 15/219,079

(22) Filed: Jul. 25, 2016

(51) Int. Cl.
| | |
|---|---|
| *H04L 27/08* | (2006.01) |
| *H04B 1/10* | (2006.01) |
| *H04B 1/04* | (2006.01) |
| *H04L 27/26* | (2006.01) |

(52) U.S. Cl.
CPC .............. *H04B 1/10* (2013.01); *H04B 1/0475* (2013.01); *H04L 27/265* (2013.01); *H04B 2001/0416* (2013.01)

(58) Field of Classification Search
CPC .... H04B 1/1036; H04B 1/1027; H04B 1/109; H04B 1/123; H04J 11/0066
See application file for complete search history.

(56) References Cited

U.S. PATENT DOCUMENTS

| | | |
|---|---|---|
| 5,263,048 A | 11/1993 | Wade |
| 5,479,440 A | 12/1995 | Esfahani |
| 5,815,529 A | 9/1998 | Wang |
| 6,031,882 A | 2/2000 | Enge et al. |
| 6,055,431 A | 4/2000 | Dybdal |
| 6,219,334 B1 | 4/2001 | Sato et al. |

(Continued)

OTHER PUBLICATIONS

Bottomley et al., "A Generalized RAKE Receiver for Interference Suppression," IEEE Journal on Selected Areas in Communications, 18(8):1536-1545 (2000).

(Continued)

*Primary Examiner* — Khanh C Tran
(74) *Attorney, Agent, or Firm* — Jones Day; Jaime D. Choi; Stephanie M. Brooker

(57) ABSTRACT

A system is provided with circuits and methods for dynamically reducing interference to maintain linear system operation and mitigate interference degradation to desired signal components. The system can include a binning subcircuit system configured to divide the digitized input signal into a plurality of spectral bins each having a power level. A power analysis subcircuit can be coupled to the binning subcircuit and configured to compare a collective power level of spectral bins to a threshold level that would produce non-linear system operation. Based upon the collective power level exceeding the threshold level, outputting a gain control signal to a variable gain amplifier so that the system remains linear. This dynamic gain control can be applied to systems that receive and/or transmit signals. Residual interference components that degrade signal components can be dynamically removed by excision and the distortion introduced by the excision process can be reduced with equalization circuitry.

17 Claims, 12 Drawing Sheets

(56) References Cited

U.S. PATENT DOCUMENTS

| | | | |
|---|---|---|---|
| 6,552,995 B1 | 4/2003 | Nakada | |
| 6,670,901 B2 * | 12/2003 | Brueske | H03G 3/3052 341/139 |
| 6,975,673 B1 * | 12/2005 | Rouquette | H04B 1/7102 375/145 |
| 7,099,270 B2 | 8/2006 | Yamaguchi | |
| 7,173,990 B2 | 2/2007 | Kim et al. | |
| 7,212,569 B1 | 5/2007 | Clark | |
| 7,277,475 B1 | 10/2007 | Nguyen et al. | |
| 7,894,556 B2 * | 2/2011 | Casabona | G01S 19/21 375/144 |
| 8,050,336 B2 | 11/2011 | Bocquet | |
| 8,155,218 B2 | 4/2012 | Hong et al. | |
| 8,199,851 B1 | 6/2012 | Dybdal et al. | |
| 8,238,410 B2 | 8/2012 | Lennen | |
| 8,259,857 B2 | 9/2012 | Dybdal et al. | |
| 8,275,067 B2 | 9/2012 | Garg et al. | |
| 8,462,879 B2 | 6/2013 | Dybdal et al. | |
| 8,614,940 B1 | 12/2013 | Dybdal et al. | |
| 8,711,675 B1 | 4/2014 | Dybdal et al. | |
| 8,804,808 B1 | 8/2014 | Dybdal et al. | |
| 9,065,521 B1 | 6/2015 | Dybdal et al. | |
| 2002/0094022 A1 * | 7/2002 | Bially | H04B 1/7102 375/148 |
| 2004/0235445 A1 * | 11/2004 | Gomez | H04B 1/30 455/307 |
| 2005/0047487 A1 | 3/2005 | Sakaue et al. | |
| 2006/0291375 A1 | 12/2006 | Nishikawa | |
| 2007/0076783 A1 * | 4/2007 | Dishman | H03G 3/3078 375/136 |
| 2008/0260014 A1 | 10/2008 | Yang et al. | |
| 2009/0225823 A1 | 9/2009 | Chen et al. | |
| 2010/0195711 A1 | 8/2010 | Hasan et al. | |
| 2010/0198588 A1 | 8/2010 | Sudo et al. | |
| 2010/0303182 A1 * | 12/2010 | Daneshrad | H04B 1/10 375/346 |
| 2011/0090939 A1 | 4/2011 | Diener et al. | |
| 2011/0200089 A1 | 8/2011 | Umeda et al. | |
| 2011/0260920 A1 | 10/2011 | Dybdal et al. | |
| 2011/0268169 A1 | 11/2011 | Mitsugi et al. | |
| 2012/0244819 A1 | 9/2012 | Tang | |
| 2014/0004812 A1 * | 1/2014 | Haub | H04B 1/1036 455/226.1 |

OTHER PUBLICATIONS

Calhoun, "Third Generation Wireless Systems, vol. 1, Post-Shannon Signal Architectures,", Artech House, Boston. pp. 344-376 (2003).

Jiang et al., "Multiuser MIMO-OFDM for Next-Generation Wireless Systems," Proceedings of the IEEE, 95 (7):1430-1469 (2007).

Johnson et al., "Blind Equalization Using the Constant Modulus Criterion: A Review," Proceedings of the IEEE, 86 (10):1927-1950 (1998).

Proakis et al., "Contemporary Communication Systems Using MATLAB® and Simulink®, Second Edition," Brooks/Cole Publishing Co., St. Paul, MN, pp. 268-273 (2004).

United States Patent and Trademark Office, Non-Final Office Action for U.S. Appl. No. 13/676,645, mailed May 24, 2013 (6 pages).

United States Patent and Trademark Office, Notice of Allowance for U.S. Appl. No. 13/676,645, mailed Sep. 12, 2013 (9 pages).

United States Patent and Trademark Office, Non-Final Office Action for U.S. Appl. No. 14/010,390, mailed Nov. 18, 2013 (7 pages).

United States Patent and Trademark Office, Notice of Allowance for U.S. Appl. No. 14/010,390, mailed Dec. 24, 2013 (9 pages).

United States Patent and Trademark Office, Notice of Allowance for U.S. Appl. No. 14/154,968, mailed Apr. 11, 2014 (14 pages).

* cited by examiner

CIRCUITS AND METHODS FOR REDUCING INTERFERENCE THAT SPECTRALLY OVERLAPS A DESIRED SIGNAL BASED ON DYNAMIC GAIN CONTROL AND/OR EQUALIZATION

FIELD OF THE INVENTION

This application generally relates to circuits and methods for reducing interference that spectrally overlaps a desired signal.

BACKGROUND OF THE INVENTION

Many techniques have been devised to reduce interference signals that otherwise may degrade communication systems, such as receivers or transmitters. For example, satellite signals received by user terminals are susceptible to interference contained in satellite downlinks as well as interference received from terrestrial sources.

A receiver may be configured to receive and process signals that have broad bandwidth spectra and powers within a certain, expected, range. For example, a receiver on a satellite may be configured to receive a group of signals that share a common region of the electromagnetic spectrum, and are multiplexed with one another using techniques known in the art. In the multiplexing technique known as code division multiple access (CDMA), each signal of the group is encoded with a unique code, and spread over the same selected portion of the spectrum as the other signals in the group. The receiver receives the group of signals, and then decodes one or more of the signals from others in the group using a priori knowledge about the unique code(s) of those signals. Alternatively, in the multiplexing technique known as frequency-division multiple access (FDMA), each signal of the group is assigned a different sub-portion of the region of the spectrum than the other signals in the group. The receiver receives and processes the group of signals, and then differentiates one or more of the signals from others in the group using a priori knowledge about the spectral sub-portion(s) of those signals. When interference protection is required, the FDMA signal collection is hopped over a wider frequency range. The hopping sequence is known to the user and the receiver, but not to an adversary. As a result, the object of frequency hopping is to force the adversary to dilute its resources over the wider bandwidth which reduces the adversary's effectiveness. Yet another multiple access technique is time division multiple access (TDMA) where individual users are assigned a time period during which that user has exclusive use of the entire bandwidth. Other users are likewise assigned their exclusive time periods that are selected so that time periods of the individual users do not overlap. The groups of signals received in CDMA, frequency hopped FDMA, and TDMA may be considered "broad bandwidth" signals because the groups of signals occupy a portion of the electromagnetic spectrum that is significantly broader than normally would be used for a single, non-multiplexed signal, that is, a "narrow bandwidth" signal.

In CDMA, frequency hopped FDMA, and TDMA, the overall power of the group of signals received by the receiver preferably is sufficiently higher than any noise sources that may be present to yield a sufficient signal-to-noise ratio (SNR) to communicate signals with adequate fidelity as measured by BER (Bit Error Rate) values. At the same time, the overall power of the group of signals also preferably is sufficiently low that the receiver may process the signals without distortion. Specifically, as is known in the art, receivers have a linear range of operation and a nonlinear range of operation. If a signal input to the receiver has a power that falls within the linear range of the receiver, then the receiver processes the received signal collection without distortion. However, if a signal input to the receiver has a power that falls within the nonlinear range of the receiver, then the received signal collection is distorted and communication performance is degraded.

Signals other than the desired group of signals that the receiver receives may be referred to as "interference," may be intentional or unintentional, and may have a broad bandwidth or a narrow bandwidth. If the receiver receives interference that falls within the same portion of the electromagnetic spectrum as the desired group of signals, then the receiver may not distinguish the interference from the group of signals again degrading communication performance. However, if the power of the interference is sufficiently high that nonlinear receiver operation occurs, not only may the interference obscure desired spectral components but also cause additional signal distortion. This additional receiver distortion may include suppression of desired signals and generation of intermodulation products between design signal components and the interference, resulting in additional degradation in receiver performance.

A receiver may have features intended to reduce the effects of such interference. For example, the receiver may be designed so as to increase its linear range, and thus reduce the risk that interference may cause distortion, e.g., by providing circuitry that remains linear at higher input power levels. However, increasing the linear range of the receiver may be expensive, and also may require a larger power supply to operate the modified circuitry.

Another known approach for reducing the effect of narrow bandwidth interference on reception of a broad bandwidth desired signal uses adaptive notch filter techniques. Specifically, a notch filter may be applied to the received signal prior to amplification so as to block the region of the spectrum where the interference is located. The amplitude, width, and spectral location of the notch filter may be adaptively modified over time by varying weighting coefficients, which may be iteratively derived using a gradient process based on an optimization criterion, such as maximum signal to noise plus interference ratio (SNIR). Such adaptive notch filter techniques have been widely applied. However, its iterative nature makes this approach is relatively slow, and thus less able to respond to rapidly changing interference.

Many of today's systems use digital implementations in processing signals. These digital implementations utilize an A/D (Analog to Digital converter) to process analog signals into digital data streams for subsequent processing. Such A/D converters become nonlinear for power inputs that are much lower than would cause nonlinearities in otherwise similar analog circuitry. Analog AGC (Automatic Gain Control) circuitry inserted prior to the A/D can be used to maintain the linearity of digital circuitry. Such AGC circuitry uses time averaging techniques to reduce the analog levels at the A/D input, and like conventional adaptive notch filters, the time averaging limits the ability to respond to dynamically varying interference signals.

Transmitters also can be negatively impacted by interference that spectrally overlaps a desired signal. Many systems use a transponder architecture where received signals are processed and routed to a transmitter for rebroadcast. Such systems may receive and transmit one or more signals and can be degraded by one or more interfering sources. The transmitter power levels, however, can be controlled to maintain linear system operation. Interfering signals in addition to the desired signals can result in nonlinear transmitter operation which distorts and degrades the desired transmitted signals.

The CDMA signal format is an example of spread spectrum modulation wherein user signals are spread over a much wider bandwidth than needed to convey the information in the user's signal. One advantage of spread spectrum modulation is protection from interference achieved by processing the user-unique codes. Similar interference protection may be achieved in FDMA formats by frequency hopping the user assigned frequency slots over a wide bandwidth in a pseudorandom sequence of frequency hop codes known to both the sender and receiver. Signal error correcting coding and interleaving techniques further add to the interference protection and are commonly used. These interference protection techniques are known in the art, but their benefits depend on linear receiver operation. The effectiveness of these techniques is significantly degraded by receiver nonlinearities.

SUMMARY OF THE INVENTION

Embodiments of the present subject matter provide circuits and methods for reducing interference that spectrally overlaps a desired signal based on dynamic gain control and/or equalization.

A system is provided with circuits and methods for dynamically reducing interference to maintain linear system operation and mitigate interference degradation to desired signal components. The system can include a binning subcircuit system configured to divide the digitized input signal into a plurality of spectral bins each having a power level. At least some of the spectral bins respectively can contain portions of a desired signal, and at least one of the spectral bins can contain interference. A power analysis subcircuit can be coupled to the binning subcircuit and configured to compare a collective power level of the spectral bins to a threshold level that would produce nonlinear system operation. Based upon the collective power level exceeding the threshold level, outputting a gain control signal to a variable gain amplifier so that the system remains linear. This dynamic gain control can be applied to systems that receive and/or transmit signals. Residual interference components that degrade signal components can be dynamically removed by excision and the distortion introduced by the excision process can be reduced with equalization circuitry.

Under one aspect, a system is provided for reducing interference in a digitized input signal. The system can include a binning subcircuit configured to divide the digitized input signal into a plurality of spectral bins. Each spectral bin can have a power level. At least some of the spectral bins respectively can contain portions of a desired signal, and at least one of the spectral bins can contain interference. The system also can include a power analysis subcircuit coupled to the binning subcircuit and configured to compare a collective power level of the spectral bins to a first threshold, and based upon the collective power level exceeding the first threshold, outputting a gain control signal. The system also can include a dynamic gain subcircuit coupled to the power analysis subcircuit and configured so as to adjust a gain of an output signal responsive to the gain control signal, the output signal being based on the input signal.

Optionally, the input signal includes a radio frequency (RF) signal. The system optionally also can include a downconverter configured to downconvert the RF signal to an intermediate frequency (IF) signal, the output signal being the IF signal; and an IF A/D converter configured to digitize the IF signal. The first threshold can be selected such that a power of the IF signal is within a linear operating range of the IF A/D converter. Optionally, the system also can include an adaptive excision circuit coupled to the IF A/D converter and configured to excise at least a portion of the interference from the digitized IF signal and to generate a signal having reduced contribution from the interference. Optionally, the system further can include an equalizer coupled to the adaptive excision circuit and configured to equalize the signal having reduced contribution from the interference.

Additionally, or alternatively, the power analysis subcircuit further can be coupled to the adaptive excision circuit and further can be configured so as to output an excision control signal based upon the collective power level exceeding a second threshold or based upon the power level of at least one of the spectral bins exceeding a third threshold. The adaptive excision circuit can adjust at least one interference excision parameter based on the excision control signal.

Additionally, or alternatively, the system can be located in a receiver.

Optionally, the digitized input signal can include a digitized intermediate frequency (IF) signal. The power analysis subcircuit further can be configured to excise at least a portion of the interference from the digitized IF signal and to generate the output signal having reduced contribution from the interference. Optionally, the dynamic gain subcircuit is configured to adjust the gain of the output signal having reduced contribution from the interference, responsive to the gain control signal.

Additionally, or alternatively, the system can be located in a transmitter.

Additionally, or alternatively, the binning subcircuit can include a filter bank and/or a Fourier transform circuit.

Additionally, or alternatively, the power analysis subcircuit optionally includes an arithmetic circuit configured to obtain the collective power level, a storage medium configured to store the first threshold, and a comparator configured to compare the collective power level to the stored first threshold.

Under another aspect, a method is provided for reducing interference in a digitized input signal. The method can include dividing the digitized input signal into a plurality of spectral bins, each spectral bin having a power level. At least some of the spectral bins respectively can contain portions of a desired signal, and at least one of the spectral bins can contain interference. The method also can include comparing a collective power level of the spectral bins to a first threshold; and based upon the collective power level exceeding the first threshold, outputting a gain control signal. The method also can include adjusting a gain of an output signal responsive to the gain control signal, the output signal being based on the input signal.

Optionally, the digitized input signal includes a digitized radio frequency (RF) signal. The method further can include downconverting the RF signal to an intermediate frequency (IF) signal, the output signal being the IF signal; and digitizing the IF signal with an IF A/D converter. The first threshold can be selected such that a power of the IF signal is within a linear operating range of the IF A/D converter. Optionally, the method further includes adaptively excising at least a portion of the interference from the digitized IF signal so as to generate a signal having reduced contribution from the interference. Optionally, the method further includes equalizing the signal having reduced contribution from the interference.

Additionally, or alternatively, the method optionally includes outputting an excision control signal based upon the collective power level exceeding a second threshold or based upon the power level of at least one of the spectral bins exceeding a third threshold; and adjusting at least one interference excision parameter based on the excision control signal.

Additionally, or alternatively, the method can be performed in a receiver.

Optionally, the input signal includes a digitized intermediate frequency (IF) signal. The method optionally further can include excising at least a portion of the interference from the digitized IF signal; and generating the output signal having reduced contribution from the interference. Optionally, the method further includes adjusting the gain of the output signal having reduced contribution from the interference, responsive to the gain control signal.

Additionally, or alternatively, the method can be performed in a transmitter.

Additionally, or alternatively, the binning can be performed using a filter bank and/or a Fourier transform circuit.

Additionally, or alternatively, the comparing optionally is performed using an arithmetic circuit configured to obtain the collective power level, a storage medium configured to store the first threshold, and a comparator configured to compare the collective power level to the stored first threshold.

Under yet another aspect, a system is provided for reducing interference in a digitized radio frequency (RF) input signal. The system can include a downconverter configured to downconvert the RF signal to an intermediate frequency (IF) signal; an IF A/D converter configured to digitize the IF signal; an adaptive excision circuit coupled to the IF A/D converter and configured to excise at least a portion of the interference from the digitized IF signal and to generate a signal having reduced contribution from the interference; and an equalizer coupled to the adaptive excision circuit and configured to equalize the signal having reduced contribution from the interference.

Under still another aspect, a method is provided for reducing interference in a digitized radio frequency (RF) input signal. The method can include downconverting the RF signal to an intermediate frequency (IF) signal; digitizing the IF signal; adaptively excising at least a portion of the interference from the digitized IF signal and generating a signal having reduced contribution from the interference; and equalizing the signal having reduced contribution from the interference.

DETAILED DESCRIPTION

Figure 1:
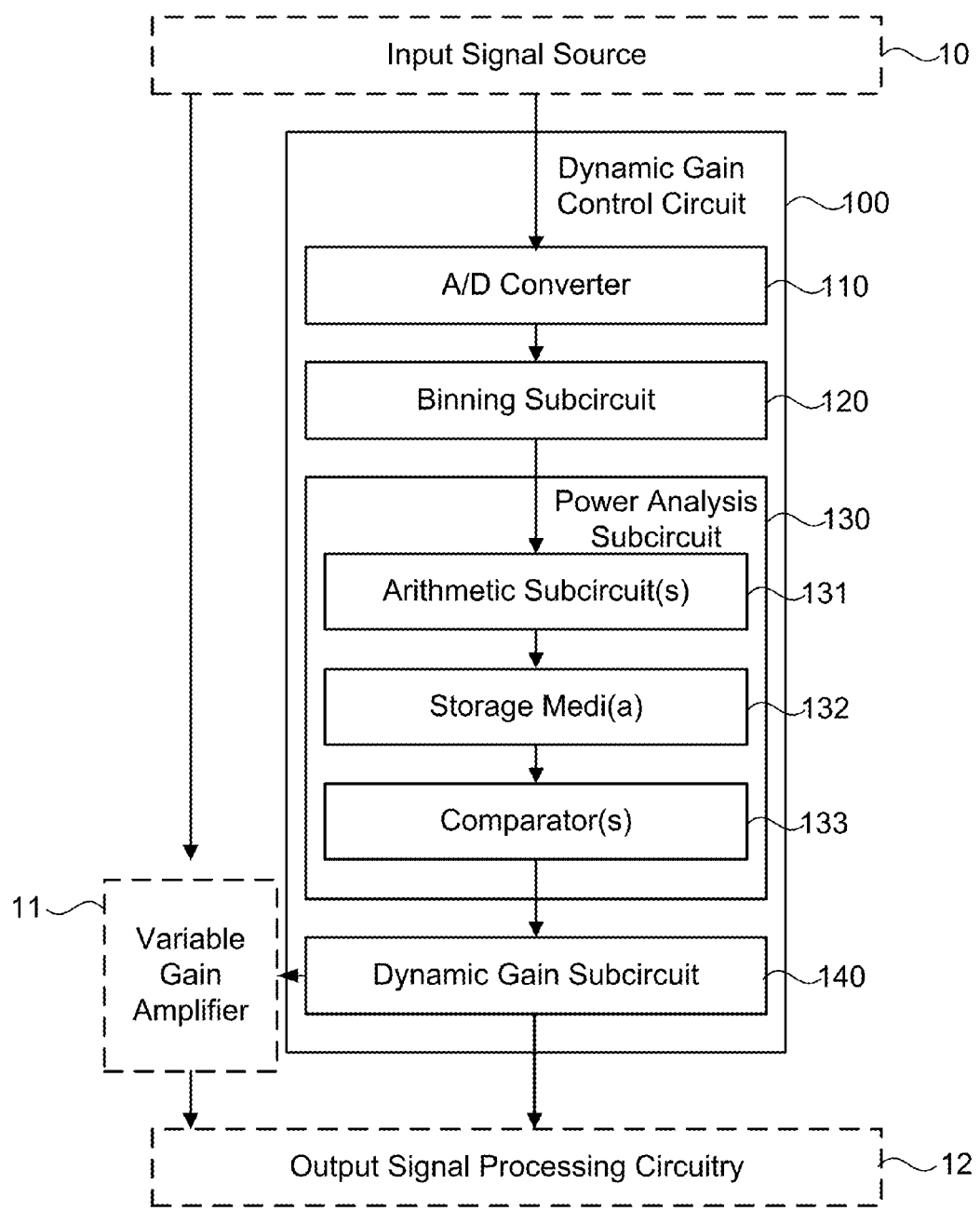
FIG. 1 schematically illustrates exemplary components of a circuit for reducing interference in an input signal based on dynamic gain control and/or equalization, according to some embodiments provided herein.

Embodiments of the present subject matter provide circuits and methods for reducing interference that spectrally overlaps a desired signal based on dynamic gain control and/or equalization. For example, the present circuits and methods provide interference suppression techniques, that optionally can be used in conjunction with previously known interference suppression techniques, and that can improve performance of a receiver or transmitter that otherwise may be adversely affected by interference. The present circuits and methods can observe, exploit, and dynamically respond to high level interference, e.g., such as may adversely limit the performance of previously known automatic gain control (AGC) systems. The present circuits and methods additionally or alternatively can utilize equalization so as to reduce residual interference and to compensate for distortion and degradation that may be caused by undesired interfering signals and/or other signal processing techniques.

Illustratively, the present circuits and methods optionally can be used in conjunction with adaptive interference excision techniques such as disclosed in U.S. Pat. Nos. 8,614,940 and 8,711,675, each to Dybdal et al. ("the Dybdal patents"), the entire contents of each of which are incorporated by reference herein. For example, input intermediate frequency (IF) signals can be converted into the digital domain using an analog to digital converter (ADC or A/D converter) with sufficient quantization to remain linear for the highest anticipated interference power. The digital output can be divided into frequency bins, e.g., using a polyphase filter bank or circuitry configured to perform a fast Fourier transform (FFT). A threshold A/D input power level based on a priori system design knowledge can quantify the ADC input power that would produce a nonlinear system response. The total ADC input power in the frequency bins can be dynamically compared to this threshold level. Based upon the total power exceeding the threshold value, a sufficient number of frequency bins can be excised (e.g., set to zero) so as to maintain system, e.g., receiver and/or transmitter, linearity. The remaining signal and residual interference components are routed to the remaining system components. Based upon the total power being less than the threshold value, the entire input signal collection can be routed to remaining system components. Adaptive interference excision can maintain a linear system response, e.g., can reduce or inhibit nonlinear intermodulation products and signal suppression. The present circuits and methods can apply equalization following interference excision, with or without the use of dynamic gain control, so as to provide enhancements in output signal quality such as described herein with reference to FIGS. 8 and 9.

The present dynamic gain control-based circuits and methods, which optionally can be implemented in conjunction with adaptive interference excision, can dynamically monitor potential interference components in the RF or IF spectrum in a receiver or a transmitter, and can determine and reduce interference components that otherwise may degrade signal reception or transmission, e.g., by causing a nonlinear response. For example, when receivers are required to operate over a very wide dynamic range (e.g., greater than or equal to 100 dB), previously known automatic gain control (AGC) circuitry commonly maintains linear receiver operation when high signal levels are present. However, if very high level interference is present as well as a desired signal, an AGC responds to the sum of interference and the desired signal powers averaged over the AGC time constant. The time averaged power level is erroneous if the high level interference is present during only a portion of the averaging time. In contrast, the present circuits and methods can dynamically examine interference components and control the IF gain, avoiding the time averaging process of a previously known AGC design. Such an approach can be referred to herein as dynamic gain control (DGC). Additionally, or alternatively, an equalizer can be used so as to filter any residual interference components and correct for signal distortion following adaptive interference excision, or following DGC, or following both adaptive interference excision and DGC.

FIG. 1 schematically illustrates exemplary components of a circuit for reducing interference in an input signal based on dynamic gain control and/or equalization, according to some embodiments provided herein. Dynamic gain control circuit 100 can be disposed between input signal source 10 and output signal processing circuitry 12. In the illustrated embodiment, dynamic gain control circuit 100 includes an analog-to-digital (A/D) converter 110 configured to receive and digitize an input signal from input signal source 10; binning subcircuit 120 coupled to A/D converter 110 and configured to divide the digitized input signal into a plurality of spectral bins; power analysis subcircuit 130 coupled to binning subcircuit 120 and configured to receive and analyze power levels in the respective power bins; dynamic gain subcircuit 140 coupled to power analysis subcircuit 130 and configured to produce a gain control signal, based on the output of power analysis subcircuit, that commands the gain of variable gain amplifier 11 whose output is routed to the output signal processing circuitry 12. Dynamic gain subcircuit 140 also can be configured to produce a second signal, also based on the output of power analysis subcircuit, that is routed to the output signal processing circuitry 12 to be used by a separate processor that controls other interference protection circuitry. Dynamic gain control circuit 100 thus can be configured so as to control the analog gain so that the output signal processing circuitry 12 maintains a linear response.

Dynamic gain control circuit 100 can be configured so as to receive an input signal, which can include a desired signal and potentially an interference signal that spectrally overlaps the desired signal, from input signal source 10. Input signal source 10 can be, but need not necessarily be, considered to be part of circuit 100. Input signal source 10 can include any suitable combination of circuitry configured so as to generate, receive, or transmit an analog or digital signal, e.g., an analog or digital baseband, intermediate frequency (IF) or radio frequency (RF) signal. The input signal source 10 can, for example, be part of a multiplexed signal collection, individual signal components within a multiple access signal collection, or a single individual signal. For example, input signal source 10 can be configured to generate or to wirelessly receive a group of signals within a particular frequency band or bands. For example, input signal source 10 can be configured to receive analog CDMA, hopped FDMA, or TDMA signals that fall within a pre-defined spectral band, and may include one or more filters configured to block signals having frequencies that fall outside of the predefined band. A further application could restrict the signal collection's output power to maintain an output level independent of the amount of traffic and its variation to maintain the desired transmitter operating point, i.e., a power control capability. Appropriate antenna designs for a variety of signals in a variety of contexts, e.g., terrestrial, aircraft, or space-based antennas, are known in the art. In some embodiments, input signal source 10 can be a pre-existing structure to which circuit 100 can be coupled.

Input signal source 10 also suitably can include an input RF filter to select the bandwidth containing desired signal components and reject other signals at frequencies outside of that bandwidth, a low noise amplifier to establish the system noise level, and optionally can contain one or more downconverters to translate the RF bandwidth containing the user signals into the bandwidth into a signal spectrum over which both the dynamic gain control circuit 100 and the output signal processing circuitry 12 operate. The downconverter circuitry can also include a variable gain amplifier 11 whose gain level is controlled by dynamic gain subcircuit 140. The variable gain amplifier 11 can be a separate component or integrated into the downconverter. Such components can be considered together to constitute analog conditioning circuitry.

Input signal source 10 can include one or more components that are located remotely from circuit 100, and one or more components that are co-located with circuit 100. For example, input signal source 10 can include a transmitter that is remote from circuit 100, and an antenna, signal conditioning circuitry, and A/D converter that are co-located with circuit 100. Alternatively, dynamic gain control circuit 100 can include A/D converter 110, in which case input signal source 10 need not include an A/D converter. As known to those of skill in the art of digital signal processing, A/D converters are commercially available devices that generate a digital version of an analog signal by sampling that signal at a specified rate, and mapping the power levels of that analog signal onto quantization levels in a digital data stream. A/D converters can have a fixed resolution, that is, can have a fixed number of quantization levels onto which it may map the power levels of the analog signal. For example, A/D converters with an 8-bit resolution can be configured to map analog power levels onto 255 quantization levels. Each bit of quantization provides a 6 dB dynamic range so that the 8-bit A/D would quantize input signals over a 48 dB dynamic range. Other values suitably can be used.

In the embodiment illustrated in FIG. 1, A/D converter 110 that receives and digitizes the input signal from input signal source 10 producing a quantized version of the desired signal and any interfering signal that shares the same input spectral band as prefiltered by the RF and IF analog filters. Binning subcircuit 120 is configured to receive the digitized input signal from A/D 110, and to divide the digitized input signal into a plurality of spectral bins, each having a power level. At least some of the spectral bins respectively can contain portions of the desired signal, and at least one of the spectral bins can contain interference that may or may not overlap desired signal components. In some embodiments, binning subcircuit 120 can include a filter bank, such as a polyphase filter bank. The filter bank can include a plurality of filters, e.g., band pass filters, that respectively separate the digitized input signal into a plurality of spectral bins and respectively output to power analysis subcircuit 130 a value corresponding to a power of the digitized signal within that spectral bin.

In some embodiments, binning subcircuit 120 can include a Fourier transform circuit. As is known in the art, a discrete Fourier transform (DFT) can be used to determine the frequency components of a signal that varies in time. An FFT is a particular variant of DFT, in which the input signal has a number of points N that is a power of two, and is Fourier transformed using an algorithm that is particularly efficient at obtaining a DFT of an input signal having a number of points that is a power of two, such as the Cooley-Tukey algorithms known in the art. The output of a DFT or FFT is a spectrally resolved version of the input signal, in which different spectral components of the incoming signal are mapped onto a predefined number (e.g., for an FFT, a power of two) of spectral "bins." In some embodiments, the signal output by A/D converter 110 has a number of points N that is a power of two, and binning subcircuit 120 is configured to perform an FFT on that signal. Circuits for performing FFTs, as well as other types of Fourier transformations of digital signals, are known in the art and are commercially available. In some embodiments, binning subcircuit 120 provides as output the respective power levels of spectral bins, at least some of which bins contain portions of the desired signal, and at least one of which contains interference. Each bin has a power level corresponding to the summed power levels of any spectral components—which spectral components can be based on the desired group of signals or based on the interference—that have been mapped to that bin.

As illustrated in FIG. 1, dynamic gain control circuit 100 includes power analysis subcircuit 130 coupled to binning subcircuit 120, e.g., so as to receive the power levels of the respective spectral bins from binning subcircuit 120. Power analysis subcircuit 130 can be configured to analyze the power levels of the bins, and based on the total power in the collection of frequency bins 120 in comparison to a predetermined threshold signal level that allows linear operation of output signal processing circuitry 12, generate a gain control signal that dynamic gain subcircuit 140 can use to control variable gain amplifier 11 so that the output signal processing circuitry 12 can maintain a linear response. Illustratively, power analysis subcircuit 130 is configured so as to compare a collective power level of the spectral bins to the predetermined threshold that would produce a nonlinear system response, and based upon the collective power level exceeding the threshold value, outputting a gain control signal suitable to cause dynamic gain subcircuit 140 to reduce the gain of the variable gain amplifier 11 to a level at which output signal processing circuitry 12 can linearly operate. The output signal processing circuitry 12 can be digitized by the output circuitry's A/D and by controlling the analog gain of the variable gain amplifier 11, linear operation of the output processing circuitry 12 will be maintained.

In the example illustrated in FIG. 1, power analysis subcircuit 130 can include one or more arithmetic subcircuits 131, one or more storage media 132, and one or more comparators 133. Arithmetic subcircuit(s) 131 can be configured to obtain the spectral bins output by binning subcircuit 120, and to sum the power levels of the spectral bins so as to obtain a collective power level of the bins. Storage medi(a) 132 can be configured to store a predetermined threshold corresponding to the threshold power level that would result in a nonlinear response of the output signal processing circuitry 12. Additionally, or alternatively, the threshold can be selected so as to increase the gain of variable gain amplifier 11 so as to use a greater proportion of the dynamic range of output signal processing circuitry 12.

Comparator(s) 133 can be coupled to storage medi(a) 132 from which it can receive the threshold, and to arithmetic subcircuit(s) 131, from which comparator 133 can respectively receive the spectral bins as well as the collective power level of the spectral bins. Comparator(s) 133 respectively can be configured to dynamically compare the collective power of the spectral bins to the threshold. Based on the comparison, which is output by comparator(s) 133, dynamic gain subcircuit 140 produces a control signal to dynamically adjust variable gain amplifier 11. Optionally, power analysis subcircuit 130 includes suitable circuitry configured to examine the power levels of the individual bins and to dynamically identify those bins containing high power levels that are anticipated to contain interference. These bins and their variations provide insight describing the nature of interference sources and its dynamics and this information can be separately communicated by such circuitry to the output signal processing circuitry 12 to separate processors to assist other interference protection capabilities resident in the output signal processing circuitry 12. Thus, power analysis subcircuit 130 can provide an interference analysis capability that describes the frequency distribution and dynamics of high level interfering signals.

The components of dynamic gain control circuit 100 dynamically adjust the gain of the output signal collection so that output signal processing circuitry 12 will have a linear response. In comparison, previously known technology for output signal processing circuitry is typically implemented in digital technology but has conventional AGC circuitry preceding the A/D. The conventional AGC suffers the averaging time that limits its ability to respond to dynamic interference variations. The present dynamic gain control circuit 100 can dynamically assure linear operation of the digital technology within output signal processing circuitry 12. In principle, a single A/D can be used for both dynamic gain control circuit 100 and the digital conversion in output signal processing circuitry 12. However, A/D 110 in dynamic gain control circuit 110 quantizes its input over the dynamic range occupied by high level interference components, whereas the A/D in output signal processing circuitry 12 quantizes the IF signal collection from variable gain amplifier 11 over a dynamic range that allows the processing of lower level desired signal components. The dynamic gain control circuit's A/D 110 does not communicate the input signal collection to the output signal processing circuitry 12 but rather can be configured so as to control the IF gain of the total signal collection, which can include one or more desired signal and potentially one or more interfering signals. If a single A/D were used in both the dynamic gain control circuit 100 and in the output signal processing circuitry 12, that A/D's dynamic range would have to span the high level interference as well as the low level desired signal components, thereby increasing the required A/D quantization—increasing its cost and reducing the analog gain before the output signal processing circuitry 12 that increases the system noise level. The gain selected by the dynamic gain control circuit 100 maintains system linearity for the complete signal collection that has desired signal components and potential interference. That accomplished, lower level interference components can be processed by the output signal processing circuitry to reduce the degradation of desired signal components.

Previously known systems typically use digital techniques that require an A/D to convert the signal that is output by output signal processing circuitry 12 into the digital domain. The present dynamic gain control circuit 100 allows this A/D, which can be referred to as the IF A/D, to remain linear. In addition to the desired signal collection, the analog input can potentially have lower level interference components that degrade the IF desired signal components. Adaptive excision techniques, such as described in the Dybdal patents referenced elsewhere herein, can be used to reduce these interference components. Adaptive excision forms frequency bins, and uses thresholding techniques that set frequency bins containing interference to zero. Adaptive excision operates on the IF data stream dynamically by excising frequency bins containing interference components. By contrast, the present dynamic gain control dynamically changes the analog gain of the entire IF spectrum, thus maintaining the linearity of the receiver's A/D.

Adaptive excision can include multiple thresholds implemented in the frequency bin processing. In adaptive excision, frequency bins potentially containing interference that would produce nonlinearity in the following electronics are identified by comparing the total power in those bins to a first threshold, and their contents are set to zero if the power exceeds the threshold, rather than the bins being processed further. The power in the frequency bins can be summed, and such sum compared to the first threshold, as a way to permit gain control of following system electronics so that, for example, the gain before transmission can be controlled to maintain the desired transmitter operating point. A second threshold can be established to set frequency bins devoid of signal components to zero since such bins have no communication value and are wasteful of output signal processing resources. In FDMA and TDMA systems, user power control is generally used to provide equitable service to system users and by identifying power differences in the bins and their time variation, a means of monitoring power control effectiveness is provided.

When adaptive excision is used to set frequency bins containing interference to zero, the excised portions(s) of signal spectra containing user signals can be distorted by the excision. Some aspects of the present systems and methods include performing equalization following excision, which equalization has been demonstrated to reduce the distortion resulting from frequency bin excision in a manner such as described elsewhere herein, e.g., with reference to FIGS. 8 and 9. Such equalization following excision can be performed without the use of DGC, or can be performed in conjunction with DGC.

Note that components of power analysis subcircuit 130 can be implemented using any suitable logic circuits known in the art. For example, arithmetic circuits are known in the art and are commercially available, as are comparators and storage media, and suitably may be coupled together with conductive elements. In other embodiments, the functionalities of one or more of arithmetic subcircuit(s) 131, comparator(s) 133, and storage medi(a) 132 can be provided by a suitably programmed field-programmable gate array (FPGA) or application-specific integrated circuit (ASIC). FPGAs are commercially available, ASIC technology can be developed to satisfy system requirements with the object to reduce power consumption, and methods of programming same to achieve desired logical programming are known in the art. In still other embodiments, the functionalities of one or more of arithmetic subcircuit(s) 131, comparator(s) 133, and storage medi(a) 132 can be provided by a suitably programmed computer, e.g., a personal computer. Additionally, note that circuitry other than arithmetic subcircuit(s) 131, comparator(s) 133, and storage medi(a) 132 can be used to provide power analysis subcircuit 130 with functionality analogous to that described herein.

Figure 2A:
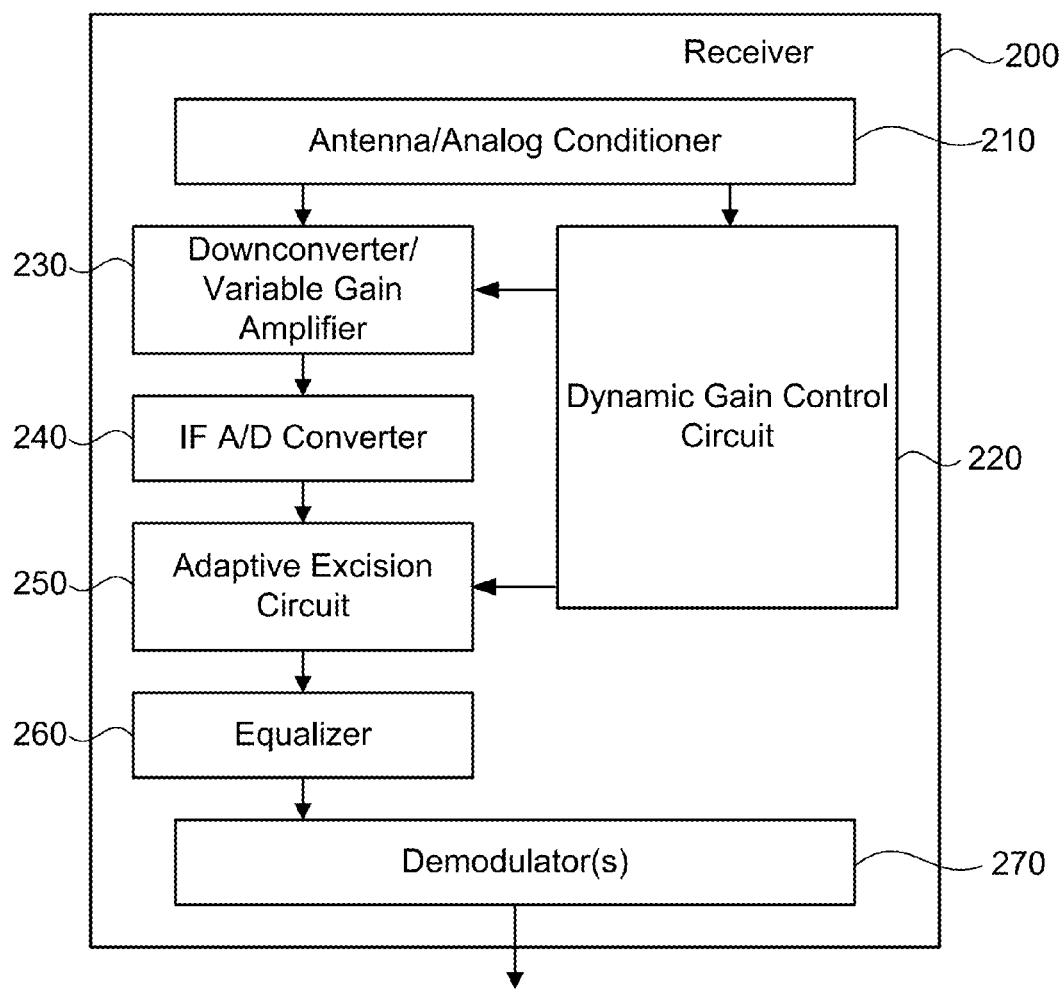
FIG. 2A schematically illustrates exemplary components of a receiver that includes a circuit for reducing interference in an input signal based on dynamic gain control and/or equalization, according to some embodiments provided herein.

Note that dynamic gain control circuit 100 suitably can be implemented in a receiver or in a transmitter, e.g., can be located in or coupled to a receiver or a transmitter. For example, FIG. 2A schematically illustrates exemplary components of a receiver that includes a circuit for reducing interference in an input signal based on dynamic gain control and/or equalization, according to some embodiments provided herein. In the exemplary embodiment illustrated in FIG. 2A, dynamic gain control circuit 220, which can be configured similarly as dynamic gain control circuit 100 described herein with reference to FIG. 1, is located in or coupled to receiver 200. Receiver 200 can include antenna/analog conditioner 210 that can be configured similarly as components described above with reference to input signal source 10 illustrated in FIG. 1. Antenna/analog conditioner 210 can receive, from an input signal source (not specifically illustrated), an analog RF input signal that includes a desired signal and interference. In a manner similar to that described above with reference to FIG. 1, dynamic gain control circuit 220 illustrated in FIG. 2A can include an RF A/D converter configured to digitize and quantize the RF input signal, a binning subcircuit configured to divide the digitized RF input signal into a plurality of spectral bins, a power analysis subcircuit configured to compare a collective power level of the bins to a predetermined threshold and to output a gain control signal based upon such comparison(s), and a dynamic gain subcircuit configured to adjust a gain of an output signal based upon the gain control signal (internal components of dynamic gain control circuit 220 not specifically illustrated in FIG. 2A, but can be configured similarly as for internal components of dynamic gain control circuit 100 illustrated in FIG. 1).

In the embodiment illustrated in FIG. 2A, receiver 200 further can include RF to IF downconverter 230 coupled to antenna/analog conditioner 210, IF A/D converter 240 coupled to downconverter that is integrated with a variable gain amplifier 230, optional adaptive excision circuit 250 coupled to IF A/D converter 250, optional equalizer 260 coupled to optional adaptive excision circuit 250 or to IF A/D converter 240, and demodulator(s) 270. Downconverter 230 can include a suitable circuit configured to downconvert the analog RF signal to an analog IF signal and to output the analog IF signal to IF A/D converter 240. Alternatively, an additional downconverter can be used following 230 to obtain a lower IF frequency with the object to reduce the A/D requirements for the baseband signal collection. A variable gain amplifier whose gain is dynamically controlled by the dynamic gain control circuitry 220 would be included in the downconversion circuitry either as a separate component or integrated into the downconverter. Illustratively, the analog IF signal can be considered to correspond to the output signal described herein with reference to FIG. 1.

Downconversion circuitry is well known in the art and commercially available. Dynamic gain control circuit 220 can be coupled to downconverter 230 so as to adjust the gain of the downconverted IF output signal that is output from downconverter 230 to IF A/D converter 240 such that the output signal has a gain sufficiently low that IF A/D converter 240 will operate within its linear range or such that the output signal has a gain sufficiently high as to use a greater proportion of the dynamic range of IF A/D converter 240 while staying within the linear range of IF A/D converter 240. For example, commercially available downconverters can include integrated gain control circuitry configured to adjust the gain of the downconverted IF output signal based on a suitable gain control signal. In previously known receivers, the gain of the signal output by the downconverter can be adjusted by an AGC, whereas in receiver 200, the gain of the signal output by the downconverter instead can be dynamically adjusted in real time (e.g., based on the instantaneous power of the spectral bins of the digitized input signal) by dynamic gain control circuit 220 without the need for modifying downconverter 230.

IF A/D converter 240 is configured to digitize the IF signal received from downconverter 230. A/D conversion circuitry is well known in the art and commercially available. The dynamic gain control threshold can be selected such that a power of the IF signal is within a linear operating range of the IF A/D converter 240. As such, IF A/D converter 240 suitably can operate without clipping or digital overflow, or can utilize an improved proportion of its linear range so as to digitize and quantize the IF signal.

Optionally, receiver 200 further can include adaptive excision circuit 250 coupled to the IF A/D converter and configured to excise at least a portion of the interference from the digitized IF signal and to generate a signal having reduced contribution from the interference. Exemplary circuitry for adaptively excising interference from a digitized signal is disclosed in U.S. Pat. Nos. 8,614,940 and 8,711, 675, each to Dybdal et al., the entire contents of each of which are incorporated by reference herein.

Optionally, the power analysis subcircuit of dynamic gain control circuit 220 further is coupled to adaptive excision circuit 250 and further is configured so as to output an excision control signal based upon the collective power level exceeding the threshold. Adaptive excision circuit 250 can be configured so as to adjust at least one interference excision parameter based on the excision control signal. For example, an adaptive excision circuit such as described in the Dybdal patents can be adapted so as to provide additional control features to maintain system linearity by varying the analog gain of the signal collection which can include one or more desired signal components and potentially one or more interference sources.

Optionally, receiver 200 further can include equalizer 260 coupled to adaptive excision circuit 250 or to IF A/D converter 240 (e.g., if optional adaptive excision circuit 250 is omitted). Equalizer 260 can be configured to equalize the signal received from adaptive excision circuit 250, e.g., the signal having reduced contribution from the interference, or the signal received from I/F converter 240. For example, following downconversion, dynamic gain control, and/or optional adaptive interference excision, the resulting signal can include residual interference or distortion. Equalizer 260 can include circuitry configured to equalize such a signal so as to reduce any residual interference or distortion. In some embodiments, dynamic gain control circuit 220 is omitted, and equalizer 260 is used so as to reduce distortion caused by adaptive excision circuit 250.

Figure 2B:
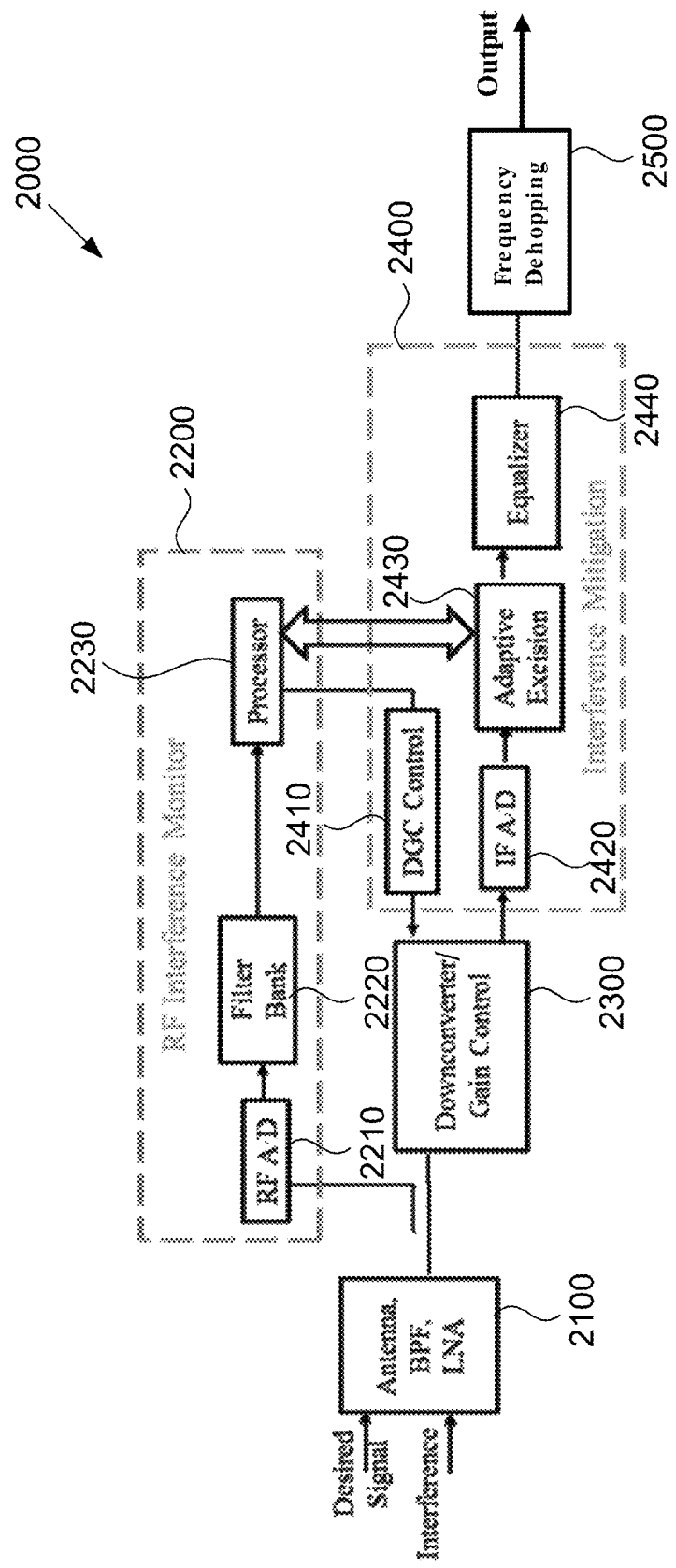
FIG. 2B schematically illustrates exemplary components of a receiver that includes a circuit for reducing interference in an input signal based on dynamic gain control and/or equalization, according to some embodiments provided herein.

In one example, FIG. 2B schematically illustrates exemplary components of a receiver that includes a circuit for reducing interference in an input signal based on dynamic gain control and/or equalization, according to some embodiments provided herein. Receiver 2000 illustrated in FIG. 2B includes signal conditioning circuitry 2100, e.g., antenna that receives an analog RF signal that includes a desired signal and interference, a bandpass filter (BPF), and low noise amplifier (LNA). The conditioned analog RF signal from the LNA is coupled to downconverter 2300 that is configured to downconvert the conditioned analog RF signal to IF, and that is configured so as to control the gain of the IF signal output from downconverter 2300 responsive to a suitable gain control signal. The conditioned RF signal from the LNA also is coupled to RF interference monitor 2200 that dynamically examines the total RF input spectrum to determine the presence of high level interference in the total RF bandwidth and to identify spectral portions of the interference that occupy the IF bandwidth. Based upon the interference power level being sufficiently large as to produce nonlinear IF amplifier operation, dynamic gain control (DGC) circuitry can be activated. Based upon interference components being present that could exceed the IF threshold, adaptive excision circuitry also, or alternatively, can be alerted. Equalizer 2440 can be used so as to reduce distortion that can be caused by one or both of the DGC circuitry or the adaptive excision circuitry.

For example, RF interference monitor 2200 illustrated in FIG. 2B includes RF A/D converter 2210 configured to digitize the conditioned RF signal, and coupled to binning circuitry, e.g., filter bank 2220. Filter bank 2220 divides the digitized RF signal into a plurality of spectral bins, and outputs the power level of each bin to processor 2230. Processor 2230 examines the output of filter bank 2220 to identify potential high level RF interference spectral characteristics and compares each of the filter bin outputs to an RF threshold level that would produce a nonlinear IF response capable of degrading operation of receiver 2000. Based upon the RF threshold level being exceeded, processor 2230 sends a suitable gain control signal to DGC control circuit 2410, which suitably adjusts the gain of the analog IF signal output by downconverter 2300 responsive to the gain control signal. For example, the value of the gain control signal (e.g., voltage) can be selected so as to cause DGC control circuitry 2410 to maintain a linear IF output thereby reducing or avoiding intermodulation products and signal suppression at the IF level. The threshold value can be derived from a priori system design data. A second threshold level also can be established to determine if high level interference within the receiver's IF bandwidth can produce a nonlinear response in the remaining receiver electronics. Subsequent interference protection techniques performed using interference mitigation circuitry 2400 optionally can be used to address remaining IF interference components that otherwise can degrade the signal of interest within the IF bandwidth.

As noted above, downconverter 2300 separately downconverts the primary RF output signal from the LNA to form the analog IF signal. The IF signal level can be established by the gain control circuitry of downconverter 2300 responsive to the control signal received from DGC control circuitry 2410. The resulting gain-controlled analog IF signal then is digitized by IF A/D converter 2420 and processed by adaptive excision circuit 2430 so as to divide the digitized IF signal into a plurality of spectral bins and to excise interference from one or more of the spectral bins in a manner such as described in U.S. Pat. Nos. 8,614,940 and 8,711,675, each to Dybdal et al. For example, frequency bins containing high level interference within the portions of the IF spectrum containing desired signal components can be excised based on a predetermined threshold level that would produce a nonlinear receiver response. After excision, equalizer 2440 can process the resulting signal so as to improve overall signal quality, e.g., by reducing remaining signal distortion and residual interference within the IF bandwidth of interest. Note that equalizer 2440 can work in combination with RF interference monitor 2200, or with adaptive excision circuit 2430, or with both RF interference monitor 2200 and with adaptive excision circuit 2430. That is, neither RF interference monitor 2200 nor adaptive excision circuit 2430 should be construed as being required. Receiver 2000 also can include additional signal processing circuitry, e.g., frequency dehopping circuit 2500, or other suitable circuitry for processing the IF signal.

The present dynamic gain control and/or equalization circuits also suitably can be implemented, e.g., coupled to or located in, a transmitter. Illustratively, transmitting systems often use AGC to maintain the design operating point of transmitters. This design operating point can be the highest power level short of nonlinear operation to maintain linearity requirements; maintaining such a power level can increase or maximize the transmitter power efficiency, e.g., by using substantially the full dynamic range of the transmitter. Previously known AGC can control the input gain to the transmitter so as to maintain the design operating point, but because the AGC responds to input power levels that are averaged over a time period, the AGC cannot respond to rapid dynamics in the input signal level. The AGC can be set so as to provide a margin below the design operating point, e.g., so as to accommodate dynamic input level variations, but the margin can reduce the transmitter power efficiency. In comparison, the present DGC based circuits and methods can dynamically follow input power variations so as to maintain the desired transmitter operating point.

Figure 3A:
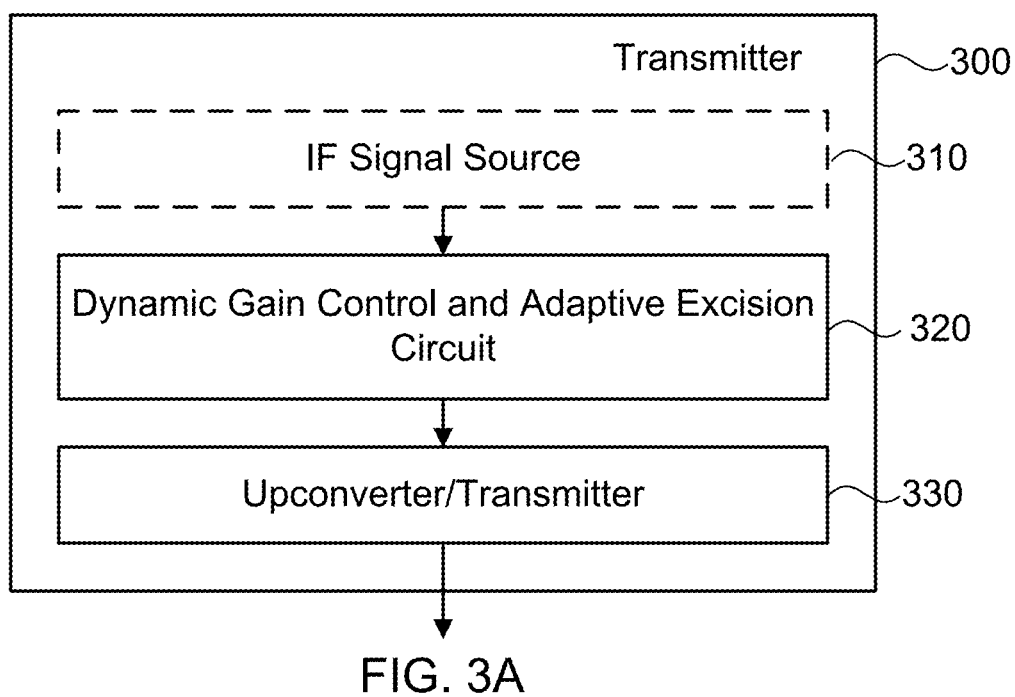
FIG. 3A schematically illustrates exemplary components of a transmitter that includes a circuit for reducing interference in an input signal based on dynamic gain control and/or equalization, according to some embodiments provided herein.

For example, FIG. 3A schematically illustrates exemplary components of a transmitter that includes a circuit for reducing interference in an input signal based on dynamic gain control and/or equalization, according to some embodiments provided herein. Transmitter 300 illustrated in FIG. 3A includes or is coupled to source 310 of a digitized IF signal. The digitized IF signal can be in a digital format or alternatively an analog IF signal can be transformed into the digital domain by a separate A/D. Dynamic gain control and adaptive excision circuit 320 is coupled so as to receive the digitized IF signal from source 310 and configured so as to excise interference from the digitized IF signal and to dynamically control the gain of the resulting output signal. For example, dynamic gain control and adaptive excision circuit 320 can include binning circuitry that is configured so as to divide the digitized IF signal into a plurality of spectral bins; a power analysis subcircuit that is configured both to excise at least a portion of the interference from the digitized IF signal and to generate the output signal having reduced contribution from the interference based on respective power levels of the bins, and to generate a gain control signal based on respective power levels of the bins or the collective power level of the bins, e.g., following excision. Dynamic gain control and adaptive excision circuit 320 also can include a dynamic gain subcircuit configured to adjust the gain of the output signal having reduced contribution from the interference, responsive to the gain control signal. Optionally, the output of dynamic gain control and adaptive excision circuit 320 can be provided to an equalizer so as to reduce distortion before the signal is provided to upconverter/transmitter 330.

Figure 3B:
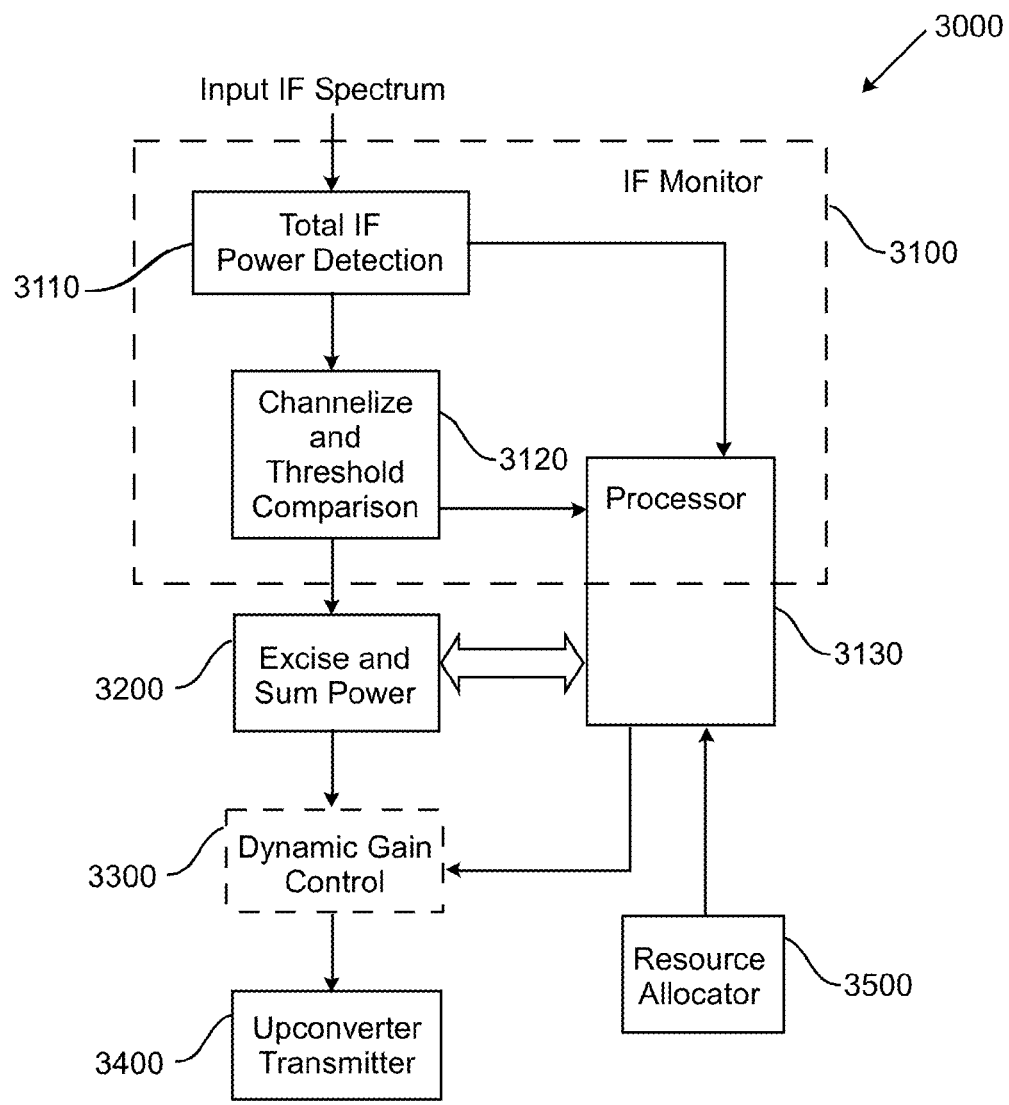
FIG. 3B schematically illustrates exemplary components of a transmitter that includes a circuit for reducing interference in an input signal based on dynamic gain control and/or equalization, according to some embodiments provided herein.

In one example, FIG. 3B schematically illustrates exemplary components of a transmitter that includes a circuit for reducing interference in an input signal based on dynamic gain control and/or equalization, according to some embodiments provided herein. Transmitter 3000 illustrated in FIG. 3B can include IF monitor circuit 3100 configured so as to receive as input a digitized IF signal. IF monitor circuit 3100 can include total IF power detection subcircuitry 3110, processor 3130, and channelization and threshold comparison subcircuitry 3120 configured so as to detect the total power of the IF signal and to provide the total power to processor 3130. Total IF power detection subcircuitry 3110 can be configured so as to channelize the IF signal (e.g., divide the IF signal into a plurality of spectral bins) and to compare the power levels in the spectral bins to one or more thresholds in a manner such as described in U.S. Pat. Nos. 8,614,940 and 8,711,675, each to Dybdal et al. Total IF power detection subcircuitry 3110 can be configured so as to provide information about the respective power levels in the bins to processor 3130. Transmitter 3000 also can include circuitry 3200 configured to excise interference from one or more of the spectral bins in a manner such as described in U.S. Pat. Nos. 8,614,940 and 8,711,675, each to Dybdal et al. Circuitry 3200 further can be configured so as to sum the power levels of the remaining bins and to provide the sum to processor 3130. Dynamic gain control circuitry 3300 can be configured so as to receive the resulting signal with reduced interference from circuitry 3200, and can be configured so as to adjust the gain of such signal, e.g., based on a dynamic gain control signal generated by processor 3130 based on comparison of the collective power level of the remaining spectral bins (following excision) to a threshold in a manner similar to that described elsewhere herein. Dynamic gain control circuit 3300 can output the resulting gain-controlled, interference-reduced IF signal to transmitter circuitry 3400, e.g., an upconverter and transmitter. Optionally, the output of circuitry 3200 and/or the output dynamic gain 3300 can be provided to an equalizer so as to reduce distortion before the signal is provided to upconverter/transmitter 3400.

Optionally, processor 3130 further can receive input from resource allocator 3500. For example, during operation of transmitter 3000, the total power of the input IF spectrum can be measured by total IF power detection subcircuitry 3110 so as to provide a gross measure of the IF dynamics. The spectrum can be channelized at circuitry 3120, e.g., using a filter bank such as described elsewhere herein, and the channel outputs can be compared to one or more thresholds. The comparisons can be used to identify frequency bins with interference, other frequency bins without signals, and with the insight of frequency assignments to users provided by resource allocator 3500 to processor 3130, identify unauthorized users. For further details regarding resource allocation, see U.S. Pat. No. 6,055,431 to Dybdal. Illustratively, systems shared by multiple users can dynamically require user assignments to the use of system assets. Bins to be excised, e.g., bins with power levels above a second threshold, can be terminated, e.g., set to zero, in channelization and threshold comparison subcircuitry 3120 or by circuitry 3200. The remaining frequency bins can be summed by circuitry 3200 to dynamically determine the instantaneous IF power level. This instantaneous power level can be compared, e.g., by processor 3130, with the IF power level required to maintain the design operating point and the IF gain set using dynamic gain control circuitry 3300 in accordance with that level so that the desired power efficiency of transmitter 3000 can be achieved. The resulting gain-controlled signal, from which at least a portion of the interference has been excised, can be provided to other transmitter circuitry, e.g., an equalizer (not specifically illustrated) or to upconverter/transmitter circuitry 3400.

As can be understood from FIG. 3B, the channelizing, thresholding, and summing can be at the digital level, and the dynamic gain control could be as well. If the system has a light traffic load, the transmitter can be operated below its design operating point. In this case, the dynamic gain control can increase its gain to maintain transmitter power efficiency. Conversely, for heavy traffic loads, the dynamic gain control and reduce its gain to maintain the transmitter's design operating point. The circuitry can be configured so as to dynamically maintain the transmitter operating point over a variety of traffic conditions. For example, the dynamic gain control for the transmitter can operate the signal collection, and the gain prior to the transmitter can be adjusted to maintain the desired operating point so as to enhance power efficiency.

The operation of circuits and subcircuits such as described herein with reference to FIGS. 1-3B now will be described in greater detail with reference to method 400 illustrated in FIG. 4A. Method 400 includes dividing the digitized input signal into a plurality of spectral bins, each spectral bin having a power level, at least some of the spectral bins respectively containing portions of a desired signal, and at least one of the spectral bins containing interference (410). For example, binning subcircuit 120 described above with reference to FIG. 1 can receive a digitized input signal from A/D converter 110, and can divide that input signal into a plurality of spectral bins. Illustratively, step 410 can be performed using a filter bank, or can be performed using a Fourier transform circuit, or can be performed using any other suitable circuitry or suitably programmed processor.

Figure 4A:
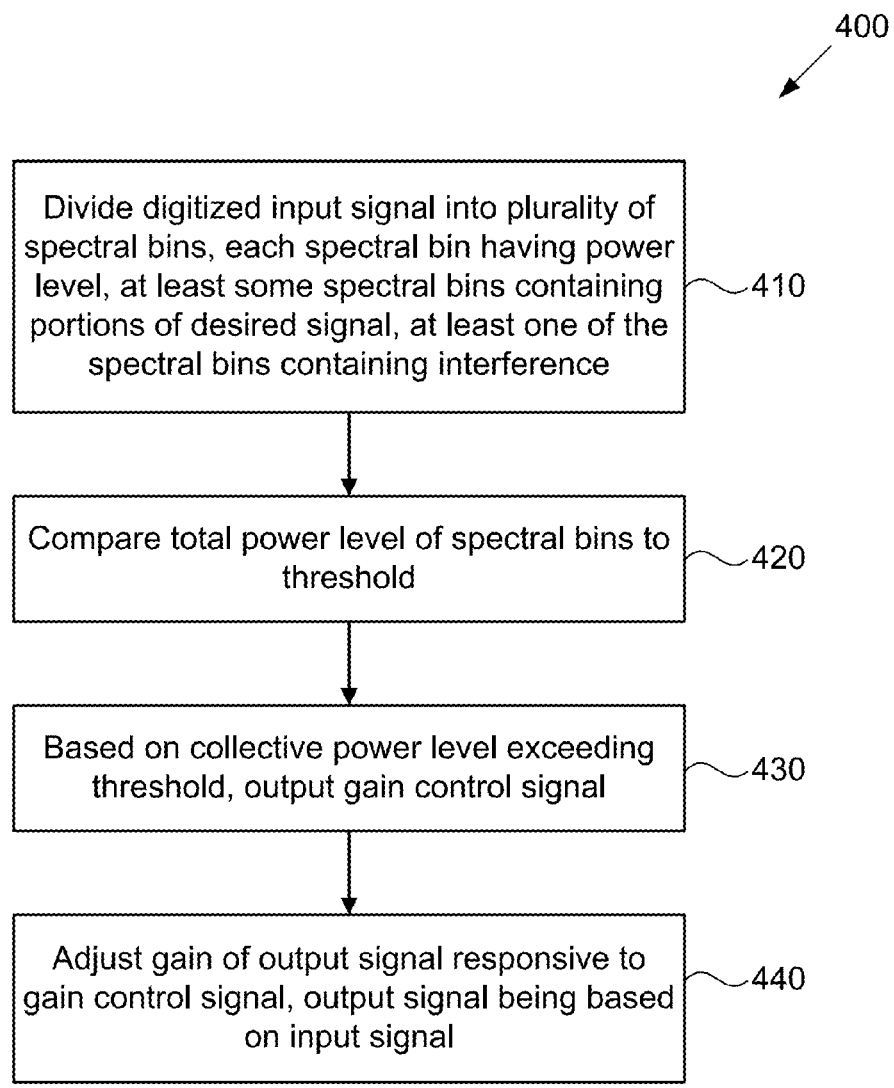
FIG. 4A schematically illustrates a flow of exemplary steps in a method for reducing interference based on dynamic gain control and/or equalization, according to some embodiments provided herein.

Method 400 illustrated in FIG. 4A also can include comparing a collective power level of the spectral bins to a threshold (420). For example, arithmetic subcircuit(s) 131 described above with reference to FIG. 1 can receive the spectral bins from binning subcircuit 120 and can calculate a collective power level of the spectral bins. Comparator(s) 133 can receive the collective power level of the spectral bins from arithmetic subcircuit(s) 131, can receive the threshold from storage medi(a) 132, and can compare the power level to the threshold.

Method 400 illustrated in FIG. 4A further can include, based upon the collective power level exceeding the threshold, outputting a gain control signal (430). For example, based on upon the comparison(s) of step 420, comparator(s) 133 described above with reference to FIG. 1 can output to dynamic gain sub circuit 140 a suitable gain control signal. Optionally, the comparing is performed using an arithmetic circuit configured to obtain the collective power level, a storage medium configured to store the threshold, and a comparator configured to compare the collective power level to the stored threshold.

Method 400 illustrated in FIG. 4A also can include adjusting a gain of an output signal responsive to the gain control signal, the output signal being based on the input signal (440). For example, based upon the gain control signal received from comparator(s) 133 illustrated in FIG. 1, dynamic gain subcircuit 140 can adjust the gain of an output signal, e.g., an output signal that is optionally processed by variable gain amplifier 11 and provided to output signal processing circuitry 12.

In some embodiments, the digitized input signal can include a digitized radio frequency (RF) signal. Optionally, method 400 can include downconverting the RF signal to an intermediate frequency (IF) signal, the output signal being the IF signal; and digitizing the IF signal with an IF A/D converter, the threshold being selected such that a power of the IF signal is within a linear operating range of the IF A/D converter, e.g., in a manner similar to that described with reference to downconverter 230 and IFA/D converter 240 illustrated in FIG. 2A or with reference to downconverter gain control circuitry 2300 and RF A/D circuitry 2210 illustrated in FIG. 2B. Method 400 optionally also can include adaptively excising at least a portion of the interference from the digitized IF signal so as to generate a signal having reduced contribution from the interference, e.g., in a manner similar to that described with reference to adaptive excision circuit 250 illustrated in FIG. 2A or adaptive excision circuit 2430 illustrated in FIG. 2B. Additionally, or alternatively, method 400 optionally can include equalizing the signal having reduced contribution from the interference, e.g., in a manner similar to that described with reference to equalizer 260 illustrated in FIG. 2A or equalizer 2440 illustrated in FIG. 2B. Additionally, or alternatively, method 400 optionally can include outputting an excision control signal based upon the collective power level exceeding a second threshold or based upon the power level of at least one of the spectral bins exceeding a third threshold; and adjusting at least one interference excision parameter based on the excision control signal, e.g., in a manner similar to that described with reference to equalizer 260 illustrated in FIG. 2A or equalizer 2440 illustrated in FIG. 2B. Additionally, or alternatively, method 400 optionally can be performed in a receiver, e.g., in a manner similar to that described with reference to receiver 200 illustrated in FIG. 2A or receiver 2000 illustrated in FIG. 2B.

In some embodiments, the input signal can include a digitized intermediate frequency (IF) signal. Method 400 optionally can include excising at least a portion of the interference from the digitized IF signal; and generating the output signal having reduced contribution from the interference, e.g., in manner similar to that described with reference to transmitter 300 illustrated in FIG. 3A or transmitter 3000 illustrated in FIG. 3B. Additionally, or alternatively, method 400 optionally can include adjusting the gain of the output signal having reduced contribution from the interference, responsive to the gain control signal, e.g., in a manner similar to that described with reference to interference and adaptive excision circuit 320 illustrated in FIG. 3A or dynamic gain control circuit 3300 illustrated in FIG. 3B. Additionally, or alternatively, method 400 optionally can be performed in a transmitter, e.g., in manner similar to that described with reference to transmitter 300 illustrated in FIG. 3A or transmitter 3000 illustrated in FIG. 3B.

Figure 4B:
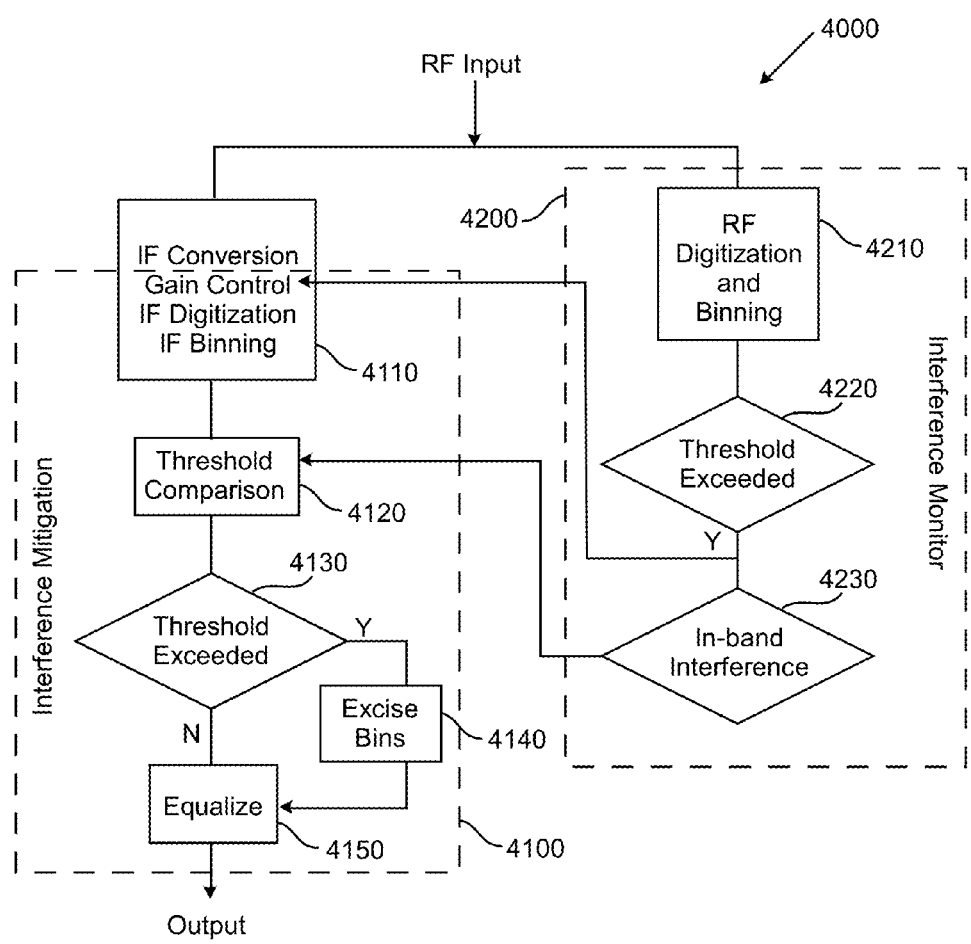
FIG. 4B schematically illustrates a flow of exemplary steps in a method for reducing interference based on dynamic gain control and/or equalization, according to some embodiments provided herein.

FIG. 4B schematically illustrates a flow of exemplary steps in a method 4000 for reducing interference based on dynamic gain control and/or equalization, according to some embodiments provided herein. In the exemplary flow of FIG. 4B, the input RF bandwidth is monitored to identify interference characteristics and if within the IF bandwidth, alerts the excision circuitry allowing it to focus on the portions of the RF spectrum where the IF interference is present. Additionally, if the system (e.g., receiver or transmitter) requires a large dynamic range, the IF gain control can be dynamically commanded to maintain the design input power range of the IF ADC as provided by the present DGC capability so that the averaging limitations of conventional AGC designs can be avoided. In this way, the IF output can remain substantially linear and not degraded by intermodulation and signal suppression at the IF level. Adaptive excision can inhibit or prevent nonlinear receiver or transmitter operation by dynamically excising appropriate frequency bins containing high level interference so as to maintain linear receiver or transmitter operation. Equalization following the excision process can reduce residual interference components and can correct distortion so that the signal quality is improved. Such excision and equalization can be, but need not necessarily be, performed in conjunction with DGC.

For example, method 4000 can include receiving an RF input signal and providing the RF input signal both to interference mitigation process 4100 and to interference monitor process 4200. Interference monitor process 4200 can include RF digitization and binning 4210; determining whether the collective power level of the RF bins exceeds a first threshold 4220; and determining whether the interference is in-band 4230. Interference mitigation process 4100 can include IF conversion, gain control, IF digitization, and IF binning 4110; comparing the collective power of the IF bins to a second threshold or the power level of respective IF bins to a third threshold 4120; determining whether one or both of the second and third thresholds are exceeded 4130; excising appropriate IF bins if so 4140; and equalizing the output signal 4150. For example, if process 4220 determines that the collective power level of the RF bins exceeds a threshold, then a dynamic gain control signal can be provided to process 4110 for use in adjusting the gain of the signal that eventually is output by equalization process 4150. Or, for example, if process 4230 determines that the interference is in-band, then an appropriate signal can be provided to process 4120.

Note that the dynamic gain control circuits and methods provided herein can adjust the gain of an output signal in "real-time," or based on the instantaneous power levels of the collection of spectral bins or of the respective spectral bins, or both. That is, the present systems and methods can dynamically adjust the gain of an output signal as the corresponding input signal arrives, and immediately thereafter provide the resulting gain-adjusted output signal to additional receiver or transmitter circuitry so as to reduce or eliminate detrimental impact of interference upon such circuitry. By comparison, adaptive gain control (AGC) circuits such as previously known can rely on averaging of a signal to adjust the gain of that signal, potentially resulting in time delays in adjusting to changes when the interference level or spectrum dynamically varies over time in an unpredictable manner.

EXAMPLES

The following examples are intended to be purely illustrative, and not limiting.

Figure 5:
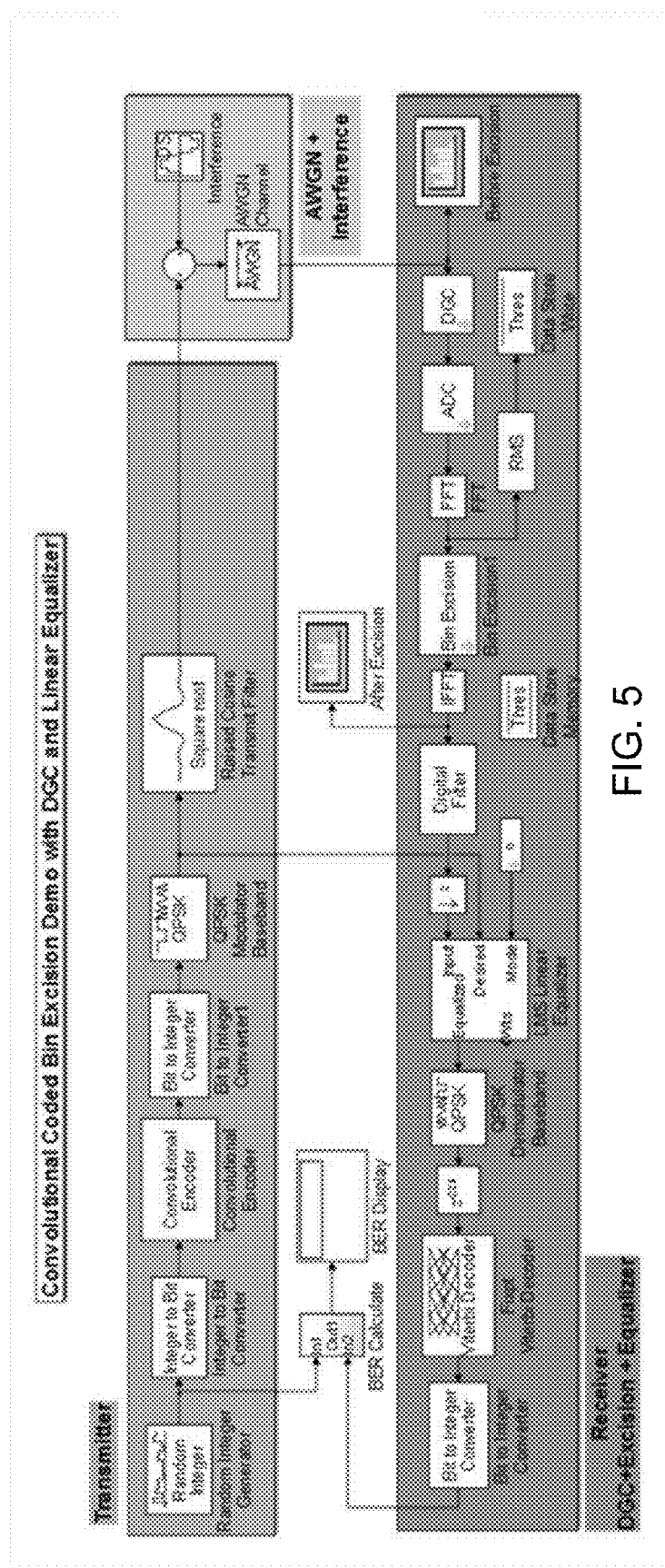
FIG. 5 schematically illustrate components of an exemplary simulated circuit for reducing interference based on dynamic gain control and/or equalization, according to one non-limiting example provided herein.

Potential performance characteristics of the present circuits and methods were characterized by using MATLAB (MathWorks, Natick, Mass.) to simulate receiver systems such as illustrated in FIG. 5 and as described herein with reference to FIGS. 1 and 2A-2B. MATLAB was used to simulate a transmitter such as illustrated in FIG. 5 that included a random integer generator block, integer to bit converter block, convolutional encoder block, bit to integer converter block, quadrature phase shift keying (QPSK) modulator at baseband block, and raised cosine transmit filter block to generate a convolution coded signal. Additive white Gaussian noise (AWGN) and an interference signal were added to the convolution coded input signal and provided as input to a receiver that included blocks for DGC, excision, and equalization, which blocks could be used in any desired combination with one another. The DGC block of the receiver dynamically adjusted the gain of the input signal in a manner similar to that described elsewhere herein. The receiver illustrated in FIG. 5 also included an ADC block to digitize the input signal, an FFT block to divide the input signal into spectral bins, threshold and root mean squared (RMS) and blocks respectively to store thresholds and compare the spectral bins to thresholds, a bin excision block to excise spectral bins based on the comparison, an iFFT block to perform an inverse Fourier transform on the remaining spectral bins following excision, a digital filter to filter the bins following iFFT, a least means squared (LMS) linear equalizer to equalize the resulting signal, a QPSK demodulator at baseband, a Viterbi decoder, and a bit to integer converter. Loss in the signal and the bit error rate (BER) were calculated before and after application of one or more of digital gain control, excision, and equalization.

Figure 6A:
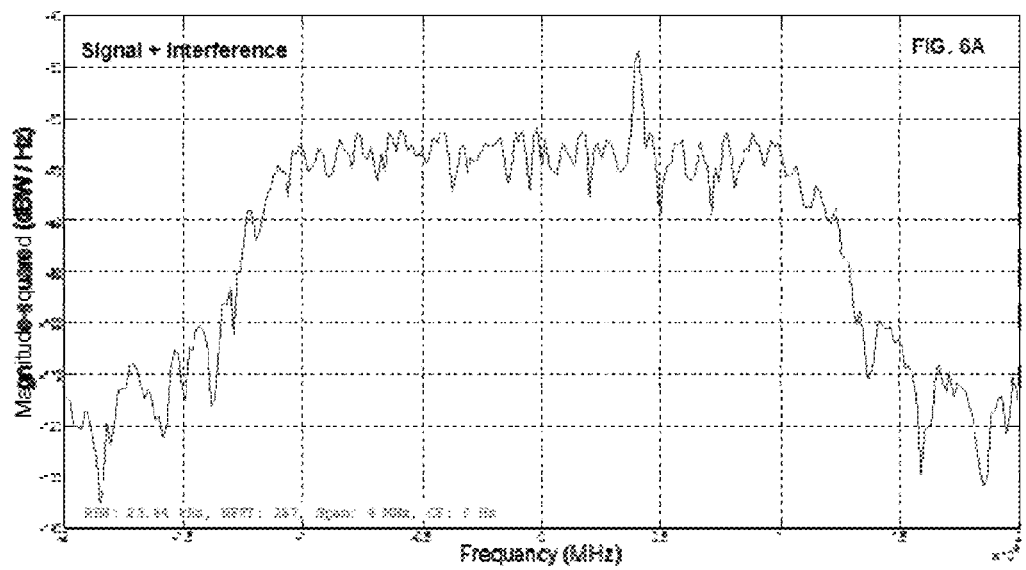
FIG. 6A illustrates a simulated quadrature phase shift keying (QPSK) signal with narrow bandwidth interference.
Figure 6B:
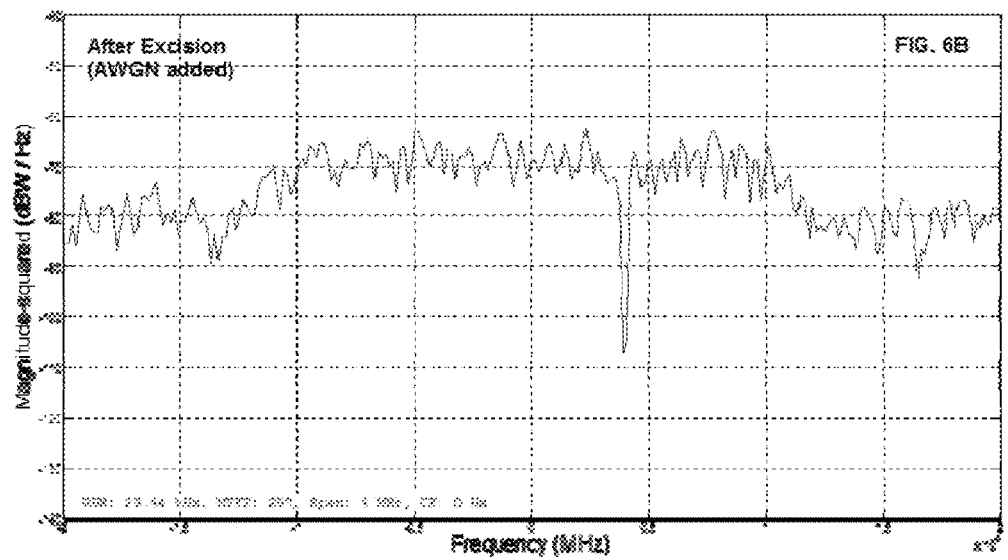
FIG. 6B illustrates the simulated QPSK signal of FIG. 6A following excision of the interference, according to one non-limiting example provided herein.

FIG. 6A illustrates a simulated quadrature phase shift keying (QPSK) signal with narrow bandwidth interference, e.g., simulated using the transmitter illustrated in FIG. 5. The signal illustrated in FIG. 6A includes a convolutional coded QPSK user signal and a single tone interference signal at various levels located inside the same frequency band as occupied by the user signal. Signals such as illustrated in FIG. 6A were used to compare different combinations of exemplary interference protection strategies: (1) bin excision only, (2) equalization only, (3) bin excision with equalization and DGC, and (4) bin excision with equalization. FIG. 6B illustrates the simulated QPSK signal of FIG. 6A following excision of the interference (strategy (1)), according to one non-limiting example provided herein. In this case, the signal frequency band was divided into 64 bins. Those bins whose RMS amplitude exceeded the excision threshold were eliminated. The excision threshold can be adjustable by the user.

Figures 7A, 7B, 7C:
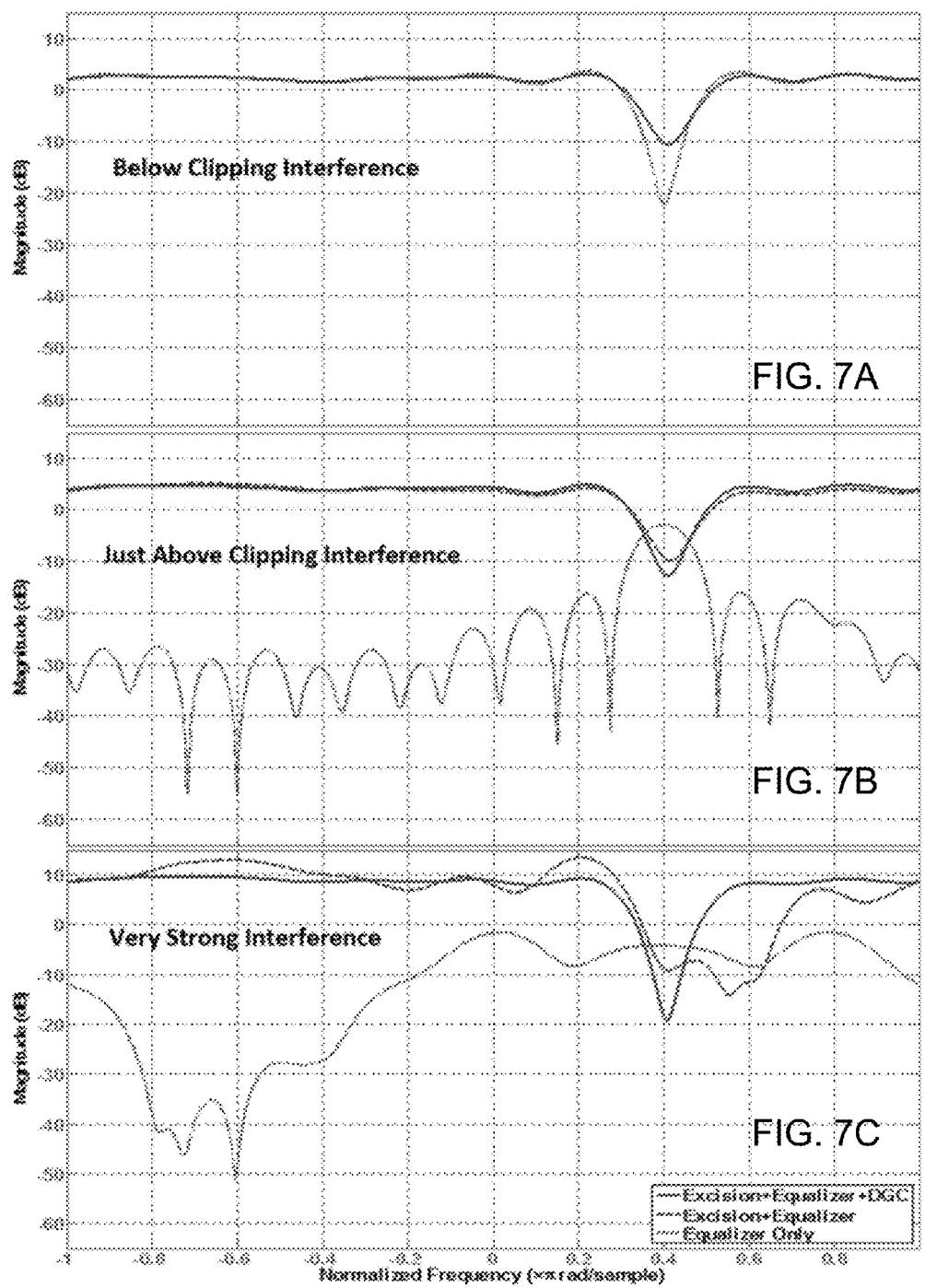
FIGS. 7A-7C illustrate an equalizer's frequency response using different interference protection strategies using different combinations of subcircuit components of the simulated circuit illustrated in FIG. 5 on the signal of FIG. 6A, according to various non-limiting examples provided herein.

FIGS. 7A-7C illustrate an equalizer's frequency response using different interference protection strategies using different combinations of subcircuit components of the simulated circuit illustrated in FIG. 5 on the signal of FIG. 6A, according to various non-limiting examples provided herein. FIGS. 7A-7C compare the equalizer's frequency response in cases with and without bin excision processing and with and without DGC. At sufficiently low interference levels, the equalizer normally behaves like a notch filter at the interference tone frequency to eliminate the interference, such as illustrated in FIG. 7A. Without interference, the equalizer provides a flat response, indicating that no signal components need to be removed. When interference is near but below the clipping level of the ADC, the bin excision processing eliminates most of the interference, so the "excision+equalizer" strategy (strategy (4)) shows a shallower notch in FIG. 7A than the "equalizer only" strategy (strategy (2)). When the interference level goes beyond the clipping threshold, the "equalizer only" strategy (strategy (2)) fails to form a notch such as shown in FIGS. 7B and 7C, while the "excision+equalizer" strategy (strategy (4)) and the "excision+equalizer+DGC" strategy (strategy (3)) both form a notch in FIG. 7B, and the "excision+equalizer+DGC" strategy (strategy (3) forms a notch in FIG. 7C at interference levels significantly exceeding the clipping threshold.

It can be understood from FIG. 7A that at interference levels below the clipping level of the simulated ADC, the frequency responses of the equalizer for the "excision+equalizer+DGC" strategy (strategy (3)) and the "excision+equalizer" strategy (strategy (4)) were similar to one another and were centered at the frequency of the interference, with a response for the "equalizer only" strategy (strategy (2)) also centered at the frequency of the interference and with greater magnitude than for strategies 3 and 4, indicating that the equalizer helped to mitigate the interference in strategy (2). It can be understood from FIG. 7B that at interference levels just above the clipping level of the simulated ADC, the frequency responses of the equalizer for the "excision+equalizer+DGC" strategy (strategy (3)) and the "excision+equalizer" strategy (strategy (4)) were similar to one another and again were centered at the frequency of the interference, with a widely varying frequency response for the "equalizer only" strategy (strategy (2)) indicating that the equalizer alone could not satisfactorily mitigate the interference. It can be understood from FIG. 7C that at interference levels significantly above the clipping level of the simulated ADC, the frequency responses of the equalizer for the "excision+equalizer+DGC" strategy (strategy (3)) and the "excision+equalizer" strategy (strategy (4)) both included components centered at the frequency of the interference. The "excision+equalizer+DGC" strategy (strategy (3)) indicating a greater response from the equalizer, indicating that the equalizer assisted with mitigating the interference. The equalizer response for the "excision+equalizer" strategy (strategy (4)) had less smoothly varying frequency components than for strategy (3), indicating that at this interference level, the equalizer had a more difficult time compensating for residual interference components. Note that although a 16 tap LMS linear equalizer was used in the present examples, other equalizer types also can be used.

Figure 8:
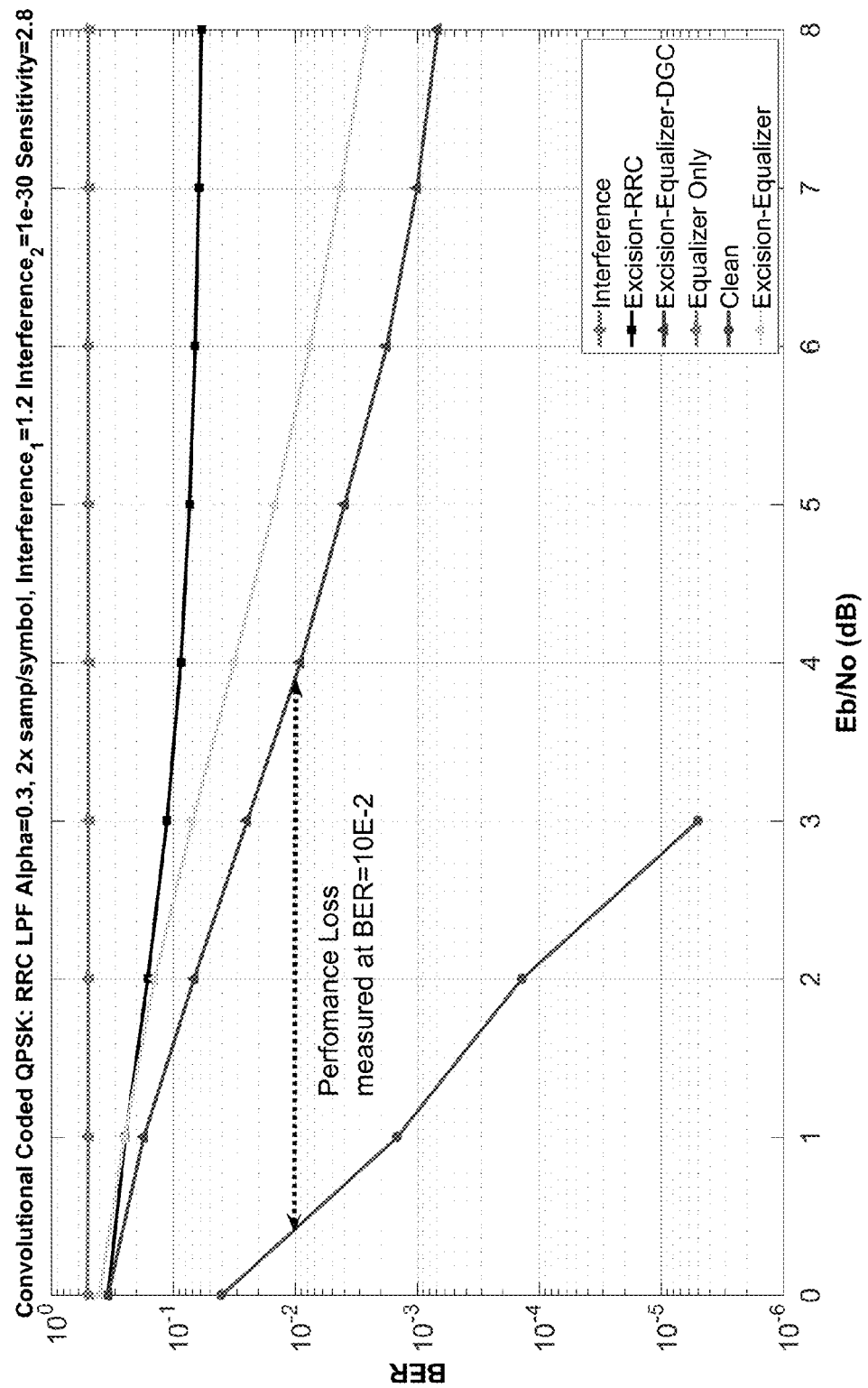
FIG. 8 illustrates the bit error rate (BER) for using different interference protection strategies using different combinations of subcircuit components of the simulated circuit illustrated in FIG. 5 on the signal of FIG. 6A, according to various non-limiting examples provided herein.

FIG. 8 illustrates the bit error rate (BER) for using different interference protection strategies using different combinations of subcircuit components of the simulated circuit illustrated in FIG. 5 on the signal of FIG. 6A, according to various non-limiting examples provided herein. The BER at various interference levels was simulated as a function of Eb/No (the energy per bit to noise power spectral density ratio) was measured and is illustrated in FIG. 8. Based on FIG. 8, it can be understood that the "excision-equalizer-DGC" strategy (strategy (3)) can have the lowest BER (best signal quality) and widest dynamic range among the four strategies, followed by the "excision-equalizer" strategy (strategy (4)), then the "excision-RRC" strategy (Root Raised Cosine, corresponding to the amplitude weighting applied to individual data pulses to reduce interference between the pulses including a data stream) (strategy (1)). Additionally, based on FIG. 8, it can be understood that the "equalizer only" strategy (strategy (2)) had a BER that was similar to that of the interference itself.

Figure 9:
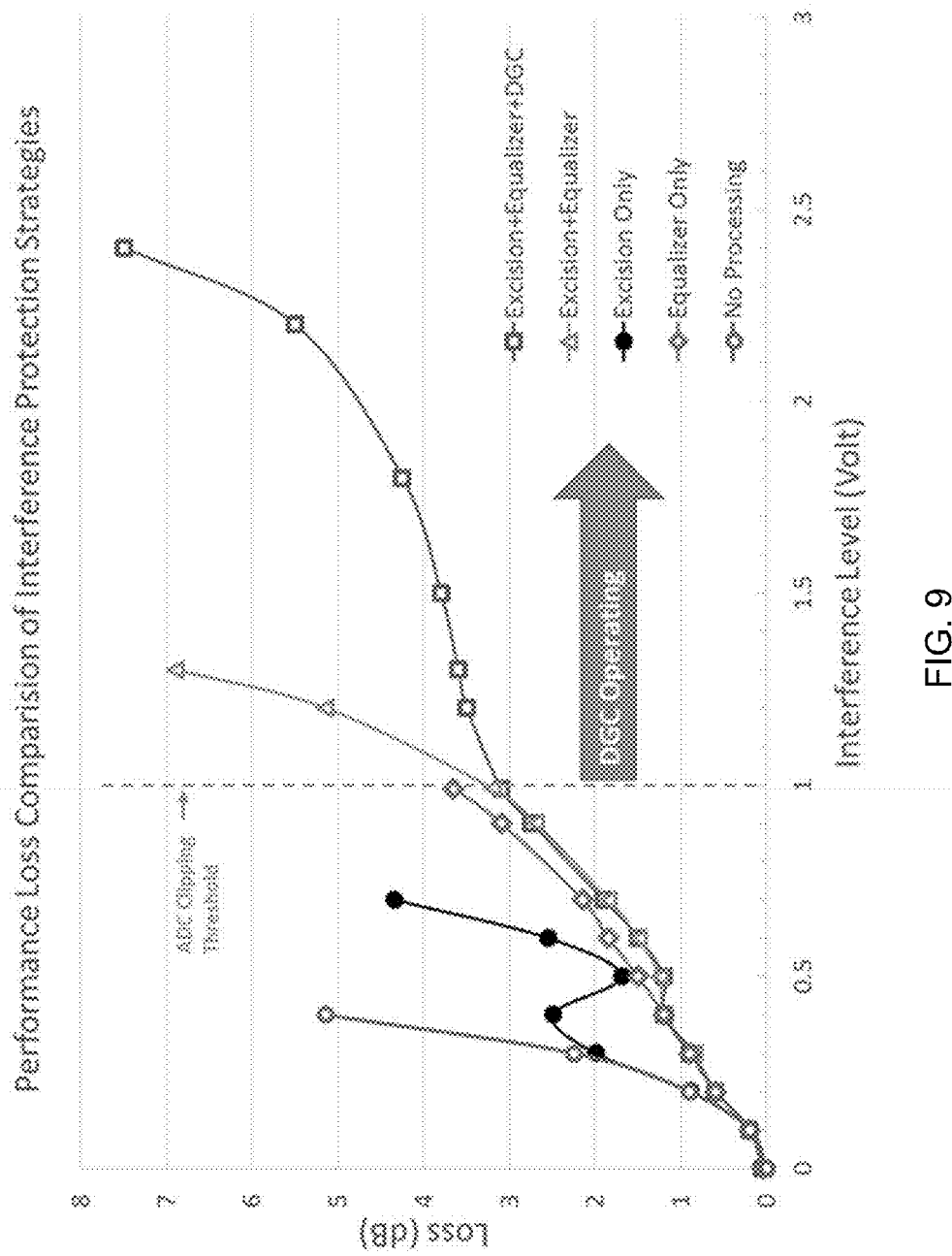
FIG. 9 illustrates the performance loss as a function of interference level following suppression of the interference using different components of subcircuit components of the simulated circuit illustrated in FIG. 5 on the signal of FIG. 6A, according to various non-limiting examples provided herein.

FIG. 9 illustrates the performance loss as a function of interference level following suppression of the interference using different components of subcircuit components of the simulated circuit illustrated in FIG. 5 on the signal of FIG. 6A, according to various non-limiting examples provided herein. The BER at various interference levels was simulated and the performance loss (Eb/No in dB required for BER=1e-2) due to interference was measured and is illustrated in FIG. 9. Based on FIG. 9, it can be understood that the "excision+equalizer+DGC" strategy (strategy (3)) can have the lowest performance loss as a function of interference level (best signal quality) and widest dynamic range among the four strategies, followed by the "excision+equalizer" strategy (strategy (4)), then "equalizer only" (strategy (2)), then "excision only" (strategy (1)). An exemplary ADC clipping threshold of 1 V also is illustrated in FIG. 9, and it can be understood that the "excision+equalizer+DGC" strategy (strategy (3)) provided satisfactory performance loss and the widest performance range even at interference levels significantly exceeding the ADC clipping threshold, with the "excision+equalizer strategy (strategy (4)) also providing some protection and increased performance range at lower interference levels that exceed the ADC clipping threshold. The losses for the "excision only" (strategy (1)) and "equalizer only" (strategy (2)) strategies were too large to be measured beyond interference levels of 1 V (e.g., that exceed the ADC clipping threshold). For example, in the "equalizer only" strategy (strategy (2)), ADC clipping caused nonlinear distortion that could not be effectively mitigated by the simulated linear equalizer. Placing a bin excision processor before the linear equalizer (strategy (4)) allowed the equalizer to perform properly.

Thus, it can be understood that dynamically controlling gain in the manner described herein can substantially reduce the BER and loss of signals that include interference, and thus can facilitate transmission, reception, demultiplexing, and decoding of such signals. Additionally, it can be understood that equalization of processed signals, e.g., signals processed using any suitable combination of one or both of DGC and bin excision, can reduce the BER and loss of signals that include interference, and thus can facilitate transmission, reception, demultiplexing, and decoding of such signals.

For example, the present circuits and methods can monitor high level interference in the total RF spectrum so as to identify high level interference components that can produce a nonlinear IF response and to provide insight into the interference characteristics and (if applicable) adversary strategy. Additionally, or alternatively, the IF gain can be dynamically controlled by the DGC circuitry so as to maintain a substantially linear IF response and can reduce or avoid susceptibility to pulsed high level interference that otherwise can produce erroneous AGC responses for receivers having wide dynamic range requirements. Additionally, or alternatively, the overall system's linearity optionally can be dynamically preserved by the adaptive IF excision high level interference components in the IF bandwidth. Additionally, or alternatively, signal distortion and residual performance can be mitigated by an equalizer so as to further improve signal quality.

The present dynamic gain control circuits and methods suitably can be applied to any communication or radar system, e.g., any receiver, transponder, or transmitter. For example, it can be useful for satellite transponders to use their limited power more effectively. Commercial systems can use previously known AGC because their traffic levels can vary slowly. In comparison, military systems can command the transponder gain states rather than use AGC, for example, because of a concern that an adversary can inject signal pulses that result in nonlinear transmitter operation and may not be accurately determined by the time constant used in AGC circuitry. Other thresholds can monitor the effectiveness of user power control. Another exemplary application, for commercial satellite systems, is the ability to detect and delete unauthorized users based on determining intended users based on their resource allocation assignments. Terrestrial wireless is another exemplary application in which the present circuits and methods can facilitate effective transmitter operation. Such an application can encounter significant dynamics in traffic demands and can benefit from DGC. Another wireless design is the cognitive systems that search for unoccupied spectra for communications over a wide bandwidth. In addition to maintaining transmitter effectiveness, the ability to dynamically excise unauthorized signals and rejecting unwanted interference from other sources and unoccupied portions of the bandwidth usefully can improve the transmitter effectiveness; additionally, noise power may not be radiated, thus reducing interference to other systems.

Additionally, it should be understood that the present circuits and methods can be implemented using existing receivers and transmitters, without the need to significantly modify the existing circuitry.

While various illustrative embodiments of the invention are described above, it will be apparent to one skilled in the art that various changes and modifications may be made therein without departing from the invention. For example, the present dynamic gain control circuits and methods suitably can be used with any circuitry that would benefit from interference reduction. The appended claims are intended to cover all such changes and modifications that fall within the true spirit and scope of the invention.

What is claimed:

1. A system for reducing interference in a digitized radio frequency (RF) input signal, the system comprising:
   a binning subcircuit configured to divide the digitized RF input signal into a plurality of spectral bins, each spectral bin having a power level, at least some of the spectral bins respectively containing portions of a desired signal, and at least one of the spectral bins containing interference;
   a power analysis subcircuit coupled to the binning subcircuit and configured to compare a collective power level of the spectral bins to a first threshold, and based upon the collective power level exceeding the first threshold, outputting a gain control signal;
   a dynamic gain subcircuit coupled to the power analysis subcircuit and configured so as to adjust a gain of an output signal responsive to the gain control signal, the output signal being based on the digitized RF input signal;
   a downconverter configured to downconvert the digitized RF input signal to an intermediate frequency (IF) signal, the output signal being the IF signal;
   an IF A/D converter configured to digitize the IF signal, the first threshold being selected such that a power of the IF signal is within a linear operating range of the IF A/D converter; and
   an adaptive excision circuit coupled to the IF A/D converter and configured to excise at least a portion of the interference from the digitized IF signal and to generate a signal having reduced contribution from the interference,
   wherein the power analysis subcircuit further is coupled to the adaptive excision circuit and further is configured so as to output an excision control signal based upon the collective power level exceeding a second threshold or based upon the power level of at least one of the spectral bins exceeding a third threshold,
   the adaptive excision circuit adjusting at least one interference excision parameter based on the excision control signal.

2. The system of claim 1, further comprising an equalizer coupled to the adaptive excision circuit and configured to equalize the signal having reduced contribution from the interference.

3. The system of claim 1, wherein the system is located in a receiver.

4. The system of claim 1, wherein the binning subcircuit comprises a filter bank.

5. The system of claim 1, wherein the binning subcircuit comprises a Fourier transform circuit.

6. The system of claim 1, wherein the power analysis subcircuit comprises an arithmetic circuit configured to obtain the collective power level, a storage medium configured to store the first threshold, and a comparator configured to compare the collective power level to the stored first threshold.

7. A system for reducing interference in a digitized intermediate frequency (IF) input signal, the system comprising:
   a binning subcircuit configured to divide the digitized IF input signal into a plurality of spectral bins, each spectral bin having a power level, at least some of the spectral bins respectively containing portions of a desired signal, and at least one of the spectral bins containing interference;
   a power analysis subcircuit coupled to the binning subcircuit and configured to compare a collective power level of the spectral bins to a first threshold, and based upon the collective power level exceeding the first threshold, outputting a gain control signal; and
   a dynamic gain subcircuit coupled to the power analysis subcircuit and configured so as to adjust a gain of an output signal responsive to the gain control signal, the output signal being based on the digitized IF input signal;
   wherein the power analysis subcircuit further is configured to excise at least a portion of the interference from the digitized IF input signal and to generate the output signal having reduced contribution from the interference.

8. The system of claim 7, wherein the dynamic gain subcircuit is configured to adjust the gain of the output signal having reduced contribution from the interference, responsive to the gain control signal.

9. The system of claim 8, wherein the system is located in a transmitter.

10. A method for reducing interference in a digitized radio frequency (RF) input signal, the method comprising:
    dividing the digitized RF input signal into a plurality of spectral bins, each spectral bin having a power level, at least some of the spectral bins respectively containing portions of a desired signal, and at least one of the spectral bins containing interference;
    comparing a collective power level of the spectral bins to a first threshold;

based upon the collective power level exceeding the first threshold, outputting a gain control signal;

adjusting a gain of an output signal responsive to the gain control signal, the output signal being based on the digitized RF input signal;

downconverting the digitized RF input signal to an intermediate frequency (IF) signal, the output signal being the IF signal;

digitizing the IF signal with an IF A/D converter, the first threshold being selected such that a power of the IF signal is within a linear operating range of the IF A/D converter;

adaptively excising at least a portion of the interference from the digitized IF signal so as to generate a signal having reduced contribution from the interference;

outputting an excision control signal based upon the collective power level exceeding a second threshold or based upon the power level of at least one of the spectral bins exceeding a third threshold; and adjusting at least one interference excision parameter based on the excision control signal.

11. The method of claim 10, further comprising equalizing the signal having reduced contribution from the interference.

12. The method of claim 10, wherein the method is performed in a receiver.

13. The method of claim 10, further comprising adjusting the gain of the output signal having reduced contribution from the interference, responsive to the gain control signal.

14. The method of claim 13, wherein the method is performed in a transmitter.

15. The method of claim 10, wherein the binning is performed using a filter bank.

16. The method of claim 10, wherein the binning is performed using a Fourier transform circuit.

17. The method of claim 10, wherein the comparing is performed using an arithmetic circuit configured to obtain the collective power level, a storage medium configured to store the first threshold, and a comparator configured to compare the collective power level to the stored first threshold.

* * * * *